United States Patent
Tsujimoto

(10) Patent No.: US 6,689,245 B2
(45) Date of Patent: Feb. 10, 2004

(54) DIE BONDING SHEET STICKING APPARATUS AND METHOD OF STICKING DIE BONDING SHEET

(75) Inventor: Masaki Tsujimoto, Tokyo (JP)

(73) Assignee: Lintec Corporation, Tokyo (JP)

( * ) Notice: Subject to any disclaimer, the term of this patent is extended or adjusted under 35 U.S.C. 154(b) by 0 days.

(21) Appl. No.: 10/164,457

(22) Filed: Jun. 6, 2002

(65) Prior Publication Data

US 2002/0187589 A1 Dec. 12, 2002

(30) Foreign Application Priority Data

Jun. 7, 2001 (JP) .................................. 2001-172847

(51) Int. Cl.[7] .................. B32B 31/12; H01L 21/44; H01L 21/301
(52) U.S. Cl. .................. 156/267; 156/230; 156/238; 156/247; 156/248; 156/257; 156/270; 156/516; 156/521; 156/498; 156/542; 438/464
(58) Field of Search .................. 156/230, 234, 156/238, 247, 248, 249, 256, 257, 267, 270, 344, 510, 516, 521, 541, 542, 498, 584; 438/464

(56) References Cited

U.S. PATENT DOCUMENTS

| | | | | | |
|---|---|---|---|---|---|
| 4,865,677 | A | * | 9/1989 | Matsushita et al. | 156/353 |
| 4,925,515 | A | * | 5/1990 | Yoshimura et al. | 156/250 |
| 5,310,442 | A | * | 5/1994 | Ametani | 156/353 |
| 5,688,354 | A | * | 11/1997 | Ko et al. | 156/267 |
| 5,961,768 | A | * | 10/1999 | Tsujimoto | 156/285 |
| 6,039,830 | A | * | 3/2000 | Park et al. | 156/267 |
| 6,238,515 | B1 | * | 5/2001 | Tsujimoto et al. | 156/379.8 |
| 6,258,198 | B1 | * | 7/2001 | Saito et al. | 156/229 |
| 6,471,806 | B1 | * | 10/2002 | McKenna et al. | 156/160 |
| 2002/0056523 | A1 | * | 5/2002 | Ishinoda | 156/496 |
| 2003/0131929 | A1 | * | 7/2003 | Yamamoto | 156/250 |

FOREIGN PATENT DOCUMENTS

| | | | |
|---|---|---|---|
| JP | 2-51249 | * | 2/1990 |
| JP | 7-14807 | * | 1/1995 |
| JP | 2001-267402 | * | 9/2001 |
| JP | 2002-134438 | * | 5/2002 |
| JP | 2002-151528 | * | 5/2002 |

* cited by examiner

Primary Examiner—Curtis Mayes
(74) Attorney, Agent, or Firm—Webb Ziesenheim Logsdon Orkin & Hanson, P.C.

(57) ABSTRACT

A die bonding sheet sticking apparatus and a method of sticking a die bonding sheet which, in the production of small electronic components, for example, semiconductor chips, effect sticking to a back surface of wafer a die bonding sheet capable of functioning not only as a protective tape at the time of dicing but also as an adhesive for die bonding at the time of die bonding of semiconductor chips after dicing onto a lead frame.

13 Claims, 13 Drawing Sheets

DIE BONDING SHEET STICKING APPARATUS AND METHOD OF STICKING DIE BONDING SHEET

BACKGROUND OF THE INVENTION

1. Field of the Invention

The present invention relates to a die bonding sheet sticking apparatus and relates to a method of sticking a die bonding sheet. In these die bonding sheet sticking apparatus and method of sticking a die bonding sheet, in the process for producing small electronic components, for example, semiconductor chips, a die bonding sheet capable of functioning as an adhesive material for die bonding is stuck to a back surface of wafer at the time of die bonding of semiconductor chips after dicing onto a lead frame.

2. Description of the Prior Art

In the conventional production of a wafer of semiconductor such as silicon (hereinafter simply referred to as "wafer"), the wafer is first produced in the form of a disk having a large diameter. A circuit pattern is formed on a surface of the wafer, and the surface of the circuit pattern is protected by a protective tape. The back side of the wafer is ground, and stuck onto a ring frame with a pressure sensitive adhesive sheet interposed therebetween. The protective tape is detached from the surface of the circuit pattern, and the wafer is cut apart into a multiplicity of dice formed chips by the use of a dicing cutter (dicing). In this state, the wafer chips are transferred to the subsequent steps such as cleaning, drying and die bonding steps.

In the conventional method of sticking a pressure sensitive adhesive sheet to a back surface of wafer, as shown in FIG. 14, wafer W is disposed on retention table 200. Pressure sensitive adhesive sheet 202 consisting of base sheet 204 and pressure sensitive adhesive layer 206 is stuck to back surface W3 of the wafer W. The pressure sensitive adhesive sheet 202 is cut by rotating upward arranged cutter 210 along the outline (circumference) W4 of the wafer W.

However, recently, the reduction of the thickness of semiconductor chips such as IC cards is increasingly demanded. The demand for semiconductor chips whose thickness has been reduced to about 100–50 $\mu$m from the conventional about 300 $\mu$m is increasing in recent years. For obtaining such semiconductor chips, it is needed to produce extremely thin wafers having the above reduced thickness.

In the use of such extremely thin wafers, there is the danger of flawing of circumferential portion W4 of the wafer W or cracking of the wafer W at the cutting of the pressure sensitive adhesive sheet 202 with the use of the cutter 210. Moreover, there is the sheet stuck at V notch portion provided on the wafer, so that there would occur failure in the recognition of wafer alignment effected in a later step.

For the purpose of avoiding such wafer flawing or wafer cracking, it is also practiced in the prior art to cut a pressure sensitive adhesive sheet along the outline of wafer in a separate step in advance and stick the cut pressure sensitive adhesive sheet to a back surface of the wafer.

Further, in the prior art, die bonding is carried out by using an ultraviolet curable pressure sensitive adhesive sheet as the pressure sensitive adhesive sheet. In this die bonding, where semiconductor chips cut apart into a multiplicity of chips are die bonded (transfer mounted) to a lead frame, ultraviolet is applied to the ultraviolet curable pressure sensitive adhesive sheet. As a result, the adhesive strength of the ultraviolet curable pressure sensitive adhesive sheet is lowered so that die bonding is practiced by using suction collets.

Still further, at the time of die bonding, it is known to separately coat a lead frame with an adhesive and effect die bonding of semiconductor chips onto the coated lead frame.

However, the current situation is that, in any case, another step is needed to thereby cause the process to be complex, bringing about a cost increase.

The present invention provides a die bonding sheet sticking apparatus for wafer which, at the time of die bonding of semiconductor chips onto a lead frame, after dicing, a sequence of steps for sticking a die bonding sheet capable of functioning as an adhesive for die bonding to a back surface of wafer can be performed in a continuous and automatic manner without wafer damaging or cracking. The present invention also provides a method of sticking a die bonding sheet with the use of the die bonding sheet sticking apparatus.

SUMMARY OF THE INVENTION

The present invention has been made with a view toward solving the above problems of the prior art and attaining the above object. The die bonding sheet sticking apparatus of the present invention includes:

a wafer supply section for accommodating a plurality of wafers therein, a wafer conveyance section including conveyance means for taking out a wafer from the wafer supply section and conveying the wafer, an alignment section for positioning the wafer taken out from the wafer supply section via the wafer conveyance means of the wafer conveyance section, a sheet sticking section for conveying the wafer arranged for given reference position at the alignment section via conveying means and for sticking a die bonding sheet to a back surface of the wafer by heating, said die bonding sheet comprising a release sheet and a base provided with heat-sensitive adhesive layer, and a sheet peeling section including sheet peeling means for peeling the release sheet of the die bonding sheet from the wafer having the die bonding sheet stuck thereto at the sheet sticking section, wherein the sheet sticking section comprises:

cutting means capable of, prior to the sticking of the die bonding sheet to the back surface of the wafer, cutting the base provided with heat-sensitive adhesive layer of the die bonding sheet in conformity with an outline of the wafer, said cutting means capable of cutting the base provided with heat-sensitive adhesive layer in the direction of a width of the die bonding sheet with a spacing of given distance from a rear end portion of the wafer in the direction of conveyance of the wafer so as to form a leaf portion; and leaf detaching means capable of, prior to the sticking of the die bonding sheet to the back surface of the wafer, detaching only the leaf portion, corresponding to portion outside the outline of the wafer, of the base provided with heat-sensitive adhesive layer of the die bonding sheet after the cutting by said cutting means.

The above structuring of the apparatus enables continuously and automatically carrying out a series of operations including taking out a wafer from a wafer cassette wherein a plurality of wafers are accommodated, alignment for positioning the wafer, sticking a die bonding sheet comprising a release sheet and a base provided with heat-sensitive adhesive layer to the back of the wafer, detaching the release sheet of the die bonding sheet, and accommodating the wafer in a wafer cassette.

The die bonding sheet also functions not only as a protective tape at the time of dicing but also as an adhesive for die bonding at the time of die bonding of semiconductor chips to a lead frame after dicing, because the die bonding sheet comprises a release sheet and a base provided with heat-sensitive adhesive layer.

Therefore, as different from the prior art, it is not needed to apply an adhesive to a lead frame at the time of die bonding. In the present invention, only heating the die bonding sheet enables not only picking up, by suction, semiconductor chips with the use of suction collets but also direct thermocompression bonding because the heat-sensitive adhesive layer of the die bonding sheet also functions as an adhesive for a lead frame.

Also, the base provided with heat-sensitive adhesive layer of the die bonding sheet is cut in conformity with the outline of wafer before the sticking of the die bonding sheet to the back surface of the wafer. Therefore, there is no danger of flawing of a peripheral portion of wafer or wafer cracking as experienced at the cutting of die bonding sheet with a cutter in the prior art. Moreover, as different from the prior art, it is not needed to cut the die bonding sheet by a separate operation in advance.

Further, prior to the sticking of the die bonding sheet to the back surface of the wafer, only the leaf portion, corresponding to portion outside the outline of wafer, of the base provided with heat-sensitive adhesive layer of the die bonding sheet after the cutting with the cutting means is detached by the use of leaf detaching means. Therefore, at the sticking of heated wafer back surface to the die bonding sheet, any fusion bonding between an outline portion of the wafer and the leaf portion corresponding to portion outside the outline of wafer can be avoided. Consequently, the release sheet of the die bonding sheet can be easily detached, without any hindrance, from the wafer.

In the die bonding sheet sticking apparatus according to the present invention, the cutting means may comprise:

a cutting blade unit including a cutting blade shaped in conformity with the outline of the wafer and a cutting blade provided in the direction of a width of the die bonding sheet with a spacing of given distance from a rear end portion of the wafer in the direction of conveyance of the wafer, the cutting blade unit being vertically movable and lifted upward from under the die bonding sheet so that the cutting blade is brought into contact with the base provided with heat-sensitive adhesive layer of the die bonding sheet, and a cutting press unit adapted to, upon lifting of the cutting blade unit upward, press the die bonding sheet downward from above the die bonding sheet to thereby effect cutting of only the base provided with heat-sensitive adhesive layer of the die bonding sheet.

This structuring enables easily and accurately cutting of the base provided with heat-sensitive adhesive layer of the die bonding sheet into portion with an outline identical with that of the wafer and the leaf portion corresponding to portion outside the outline of wafer.

Further, in the die bonding sheet sticking apparatus according to the present invention, the leaf detaching means may include a temperature regulating unit capable of cooling or heating the die bonding sheet from its release sheet side at the time of detaching only the leaf portion, corresponding to portion outside the outline of wafer, of the base provided with heat-sensitive adhesive layer of the die bonding sheet.

For example, there can be mentioned the case wherein the heat-sensitive adhesive layer of the die bonding sheet is constituted of an epoxy resin while the release sheet of the die bonding sheet is constituted of polyethylene terephthalate (PET). If the heat sensitive adhesive layer is constituted of an epoxy resin, the adherence between the base provided with heat-sensitive adhesive layer and the release sheet may be increased depending on the change of ambient temperature to thereby cause it difficult to peel the base provided with heat-sensitive adhesive layer.

However, the regulating of the temperature of die bonding sheet by cooling or heating in conformity with the condition of the die bonding sheet according to the present invention enables stabilizing the adherence between the release sheet and the heat-sensitive adhesive layer. As a result, the peeling of the release sheet can be stably effected at the time of peeling. That is, the adherence between the base provided with heat-sensitive adhesive layer and the release sheet can be stabilized without any change thereof, so that only the leaf portion, corresponding to portion outside the outline of wafer, of the base provided with heat-sensitive adhesive layer can be easily peeled.

Still further, in the bonding sheet sticking apparatus of the present invention, the leaf detaching means may include a suction detaching unit adapted to, after the cutting by the cutting means, detach only the leaf portion, corresponding to portion outside the outline of wafer, of the base provided with heat-sensitive adhesive layer of the die bonding sheet by suction from thereunder.

This structuring enables easily detaching only the leaf portion, corresponding to portion outside the outline of wafer, of the base provided with heat-sensitive adhesive layer of the die bonding sheet.

Still further, in the die bonding sheet sticking apparatus of the present invention, the leaf detaching means may include a removing unit capable of removing the leaf portion, corresponding to portion outside the outline of wafer, having been detached by the suction detaching unit, from the suction detaching unit.

This structuring enables easily removing the leaf portion, corresponding to portion outside the outline of wafer, having been detached by the suction detaching unit, from the suction detaching unit.

Furthermore, in the die bonding sheet sticking apparatus of the present invention, the suction detaching unit may include suction members shaped like a comb, and the removing unit may include shake down members shaped like a comb which can be inserted in interstices of the comblike suction members of the suction detaching unit, so that the leaf portion corresponding to portion outside the outline of wafer, having been detached by suction by the comblike suction members of the suction detaching unit, is removed from the suction detaching unit by inserting the comblike shake down members of the removing unit in the interstices of the comblike suction members of the suction detaching unit from thereunder.

This structuring enables easily and securely removing the leaf portion corresponding to portion outside the outline of wafer, having been detached by suction by the comblike suction members of the suction detaching unit, from the suction detaching unit only by inserting the comblike shake down members of the removing unit in the interstices of the comblike suction members of the suction detaching unit from thereunder.

Therefore, failure to remove the leaf portion from the suction detaching unit can be avoided with the result that continuous operation of the die bonding sheet sticking apparatus of the present invention would not be hindered to thereby attain an enhancement of production efficiency.

Still further, in the die bonding sheet sticking apparatus of the present invention, the sheet sticking section may include:

a mount table adapted to mount the wafer thereon and including a heater capable of heating the wafer, and a sticking press unit capable of pressing the die bonding sheet having been heated by the mount table downward from above the die bonding sheet so as to stick the base provided with heat-sensitive adhesive layer of the die bonding sheet to the back surface of the wafer disposed on the mount table.

This structuring enables heating the die bonding sheet and enables easily and securely sticking the base provided with heat-sensitive adhesive layer to the back surface of the wafer.

Moreover, in the die bonding sheet sticking apparatus of the present invention, the mount table may protrude upward at a peripheral portion thereof to thereby provide a suction part adapted to fix a peripheral portion of the surface of wafer by suction, the mount table further including an air blow space part surrounded by the suction part and adapted to support the surface of wafer upward from thereunder by compressed air.

This structuring enables avoiding contact of the mount table with the circuit pattern lying on the surface of the wafer, so that damaging of the circuit pattern can be prevented. Further, the entirety of the wafer is supported upward by compressed air, so that the pressing downward by means of the sticking press unit at the time of sticking the die bonding sheet would not bring about bubbling between the die bonding sheet and the back surface of the wafer and would not cause wafer cracking, breakage or damaging.

Moreover, in the die bonding sheet sticking apparatus of the present invention, the sticking press unit may include a fixed roller and a press moving roller, the fixed roller capable of retaining the die bonding sheet at a position upstream of the wafer, the press moving roller adapted to be moved downstream to thereby effect sticking of the die bonding sheet to the back surface of the wafer.

By virtue of this structuring, the fixed roller retains the die bonding sheet at a position upstream of the wafer while the press moving roller is moved downstream, so that any air between the back surface of the wafer and the die bonding sheet is expelled from the downstream side. Consequently, trapping of air between the back surface of the wafer and the die bonding sheet can be avoided. Further, by inclining the die bonding sheet, sticking with a given tension can be effected without any wrinkling. Therefore, the die bonding sheet can be securely stuck to the back surface of the wafer.

In the die bonding sheet sticking apparatus of the present invention, the press moving roller may be provided with a heating unit.

This structuring enables further heating the die bonding sheet by means of the heating unit of the press moving roller, so that the base provided with heat-sensitive adhesive layer can be stuck to the back surface of the wafer more easily and more securely.

Still further, in the die bonding sheet sticking apparatus of the present invention, the sheet peeling section may include a mount table adapted to mount the wafer thereon, the mount table protruding upward at a peripheral portion thereof to thereby provide a suction part adapted to fix a peripheral portion of the surface of wafer by suction, the mount table further including an air blow space part surrounded by the suction part and adapted to support the surface of wafer upward from thereunder by compressed air.

This structuring enables avoiding contact of the mount table with the circuit pattern lying on the surface of the wafer, so that damaging of the circuit pattern can be prevented. Further, the entirety of the surface of wafer is supported upward by compressed air, so that, at the time of peeling the release sheet of the die bonding sheet, there would not occur wafer cracking, breakage or damaging.

In the die bonding sheet sticking apparatus of the present invention, still further, the sheet peeling means may include a fixed roller and a pair of detaching moving rollers, the fixed roller capable of retaining the die bonding sheet at its downstream side, the pair of peeling moving rollers adapted to have the die bonding sheet wound round and sandwiched between them and to move upstream of the die bonding sheet so that the release sheet of the die bonding sheet is peeled from the wafer.

This structuring enables peeling the release sheet of the die bonding sheet from the wafer securely and easily.

In another aspect of the present invention, there is provided a method of sticking a die bonding sheet, comprising:

a die bonding sheet cutting step comprising, prior to sticking of a die bonding sheet comprising a release sheet and a base provided with heat-sensitive adhesive layer to a back surface of wafer, cutting only the base provided with heat-sensitive adhesive layer of the die bonding sheet in conformity with an outline of the wafer, said die bonding sheet cutting step being cutting the base provided with heat-sensitive adhesive layer in the direction of a width of the die bonding sheet with a spacing of given distance from a rear end portion of the wafer in the direction of carry of the wafer so as to form a leaf portion; and a leaf detaching step comprising detaching only the leaf portion, corresponding to portion outside the outline of the wafer, of the base provided with heat-sensitive adhesive layer of the die bonding sheet after the cutting in the die bonding sheet cutting step, a die bonding sheet sticking step comprising, after the cutting in conformity with the outline of the wafer in the die bonding sheet cutting step and further after the detaching of only the leaf portion, corresponding to portion outside the outline of the wafer, of the base provided with heat-sensitive adhesive layer of the die bonding sheet, sticking the base provided with heat-sensitive adhesive layer of die bonding sheet which has an outline conforming to that of the wafer, while heating, to the back surface of the wafer, and a sheet peeling step comprising peeling the release sheet of the die bonding sheet from the wafer having the die bonding sheet stuck thereto in the die bonding sheet sticking step.

In this method, the die bonding sheet functions not only as a protective tape at the time of dicing but also as a pressure sensitive adhesive for die bonding at the time of die bonding of semiconductor chips to a lead frame after dicing, because the die bonding sheet comprises a release sheet and a base provided with heat-sensitive adhesive layer.

Therefore, as different from the prior art, it is not needed to paste an adhesive to a lead frame at the time of die bonding. In the present invention, only heating the die bonding sheet enables not only picking up, by suction, semiconductor chips with the use of suction collets but also direct thermocompression bonding because the base provided with heat-sensitive adhesive layer of the die bonding sheet functions as an adhesive for a lead frame.

Also, the base provided with heat-sensitive adhesive layer of the die bonding sheet is cut in conformity with the outline of wafer before the sticking of the die bonding sheet to the back surface of the wafer. Therefore, there is no danger of flawing of a peripheral portion of wafer or wafer cracking as experienced at the cutting of die bonding sheet with a cutter in the prior art. Moreover, as different from the prior art, it is not needed to cut the die bonding sheet by another operation in advance.

Further, prior to the sticking of the die bonding sheet to the back surface of the wafer, only the leaf portion, corresponding to portion outside the outline of wafer, of the base provided with heat-sensitive adhesive layer of the die bonding sheet after the cutting in the cutting step is detached in the leaf detaching step. Therefore, at the sticking of heated wafer back surface to the die bonding sheet, any fusion bonding between an outline portion of the wafer and the leaf portion corresponding to portion outside the outline of wafer can be avoided. Consequently, the release sheet of the die bonding sheet can be easily detached, without any hindrance, from the wafer.

1: sticking apparatus (die bonding sheet sticking apparatus),
2: die bonding sheet,
4A, 4B: release sheet,
5: heat-sensitive adhesive layer,
6: base,
7: heat-sensitive adhesive base material (base provided with heat-sensitive adhesive layer),
7A: leaf portion,
10: wafer supply section,
12: wafer carrier,
14: lift driving motor,
16: ball screw mechanism,
20: wafer conveyance section,
22: mobile arm,
24: suction member,
30: alignment section,
32: turn table,
40: sheet sticking section,
42: mount table,
44: sheet feeding section,
45: wafer heating sticking unit,
46: sheet cutting section,
48: sticking press section,
50: sheet detaching section,
60: guide rail,
62: supply roller,
64: guide roller,
66: separating roller,
68: tension roller,
70: cutting/sticking position,
72: guide roller,
75: release material winding section,
76: cutting blade unit,
78: cutting blade,
80: guide rail,
82: sheet cutting press unit,
84: cutting press roller,
86: guide rail,
88: cut,
90: cylinder,
92: suction part,
94, 126: air blow space part,
96: air supply pipe,
98: cylinder,
102: fixed roller,
104: press moving roller,
108, 110: peeling moving roller (sheet peeling means),
112: fixed roller (sheet peeling means),
114: residue winding section,
116: peeling table,
118: guide rail,
120: cylinder mechanism, 122: suction part,
124: air supply pipe,
140: leaf detaching unit,
142: suction section (leaf detaching means),
144: suction support member (leaf detaching means),
148: suction pad (leaf detaching means),
160: cooling unit (temperature regulating unit),
162: fan section,
164: contact section,
180: removing unit,
182: shake down arm,
200: retention table,
202: pressure sensitive adhesive sheet,
204: base sheet,
206: pressure sensitive adhesive layer,
210: cutter,
W: wafer,
W1: circumferential portion,
W2: surface,
W3: back surface, and
L: given distance.

DETAILED DESCRIPTION OF THE INVENTION

Embodiments of die bonding sheet sticking apparatus according to the present invention will be described below with reference to the appended drawings.

Figure 1:
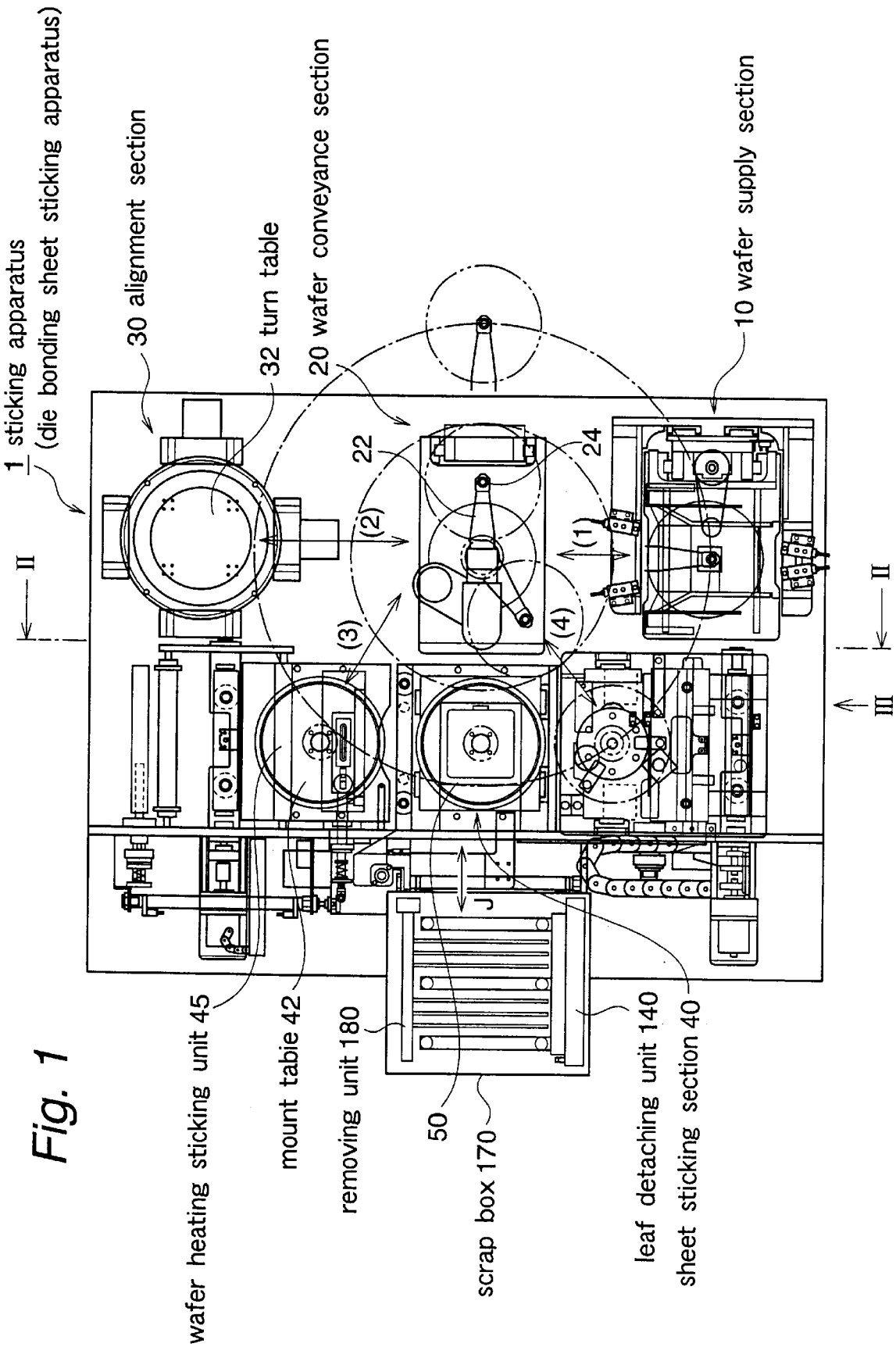
FIG. 1 is a plan view showing the entirety of one form of die bonding sheet sticking apparatus according to the present invention.
Figure 2:
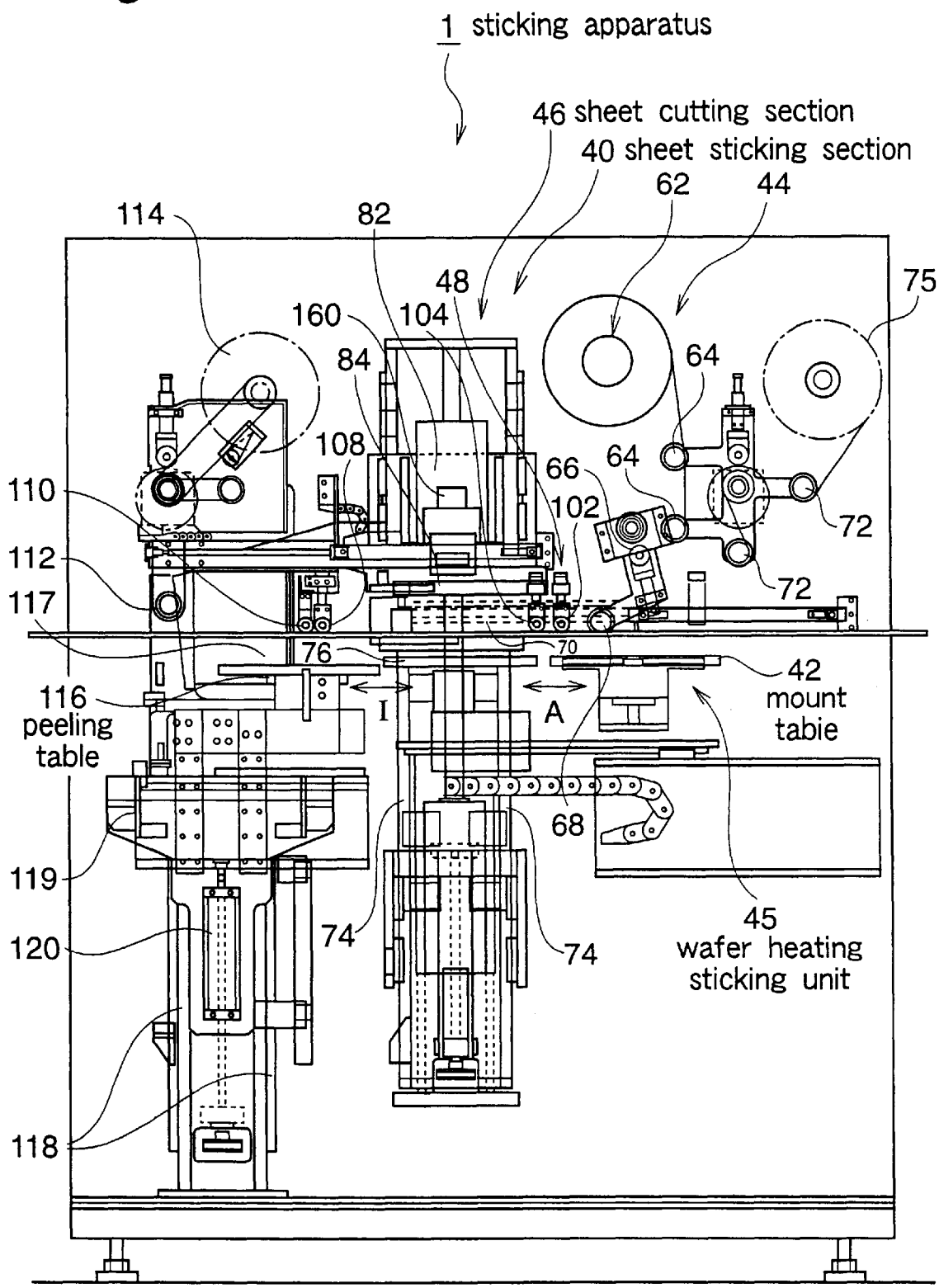
FIG. 2 is a view of the die bonding sheet sticking apparatus of FIG. 1 taken in the direction of the arrow along the line II—II of FIG. 1.
Figure 3:
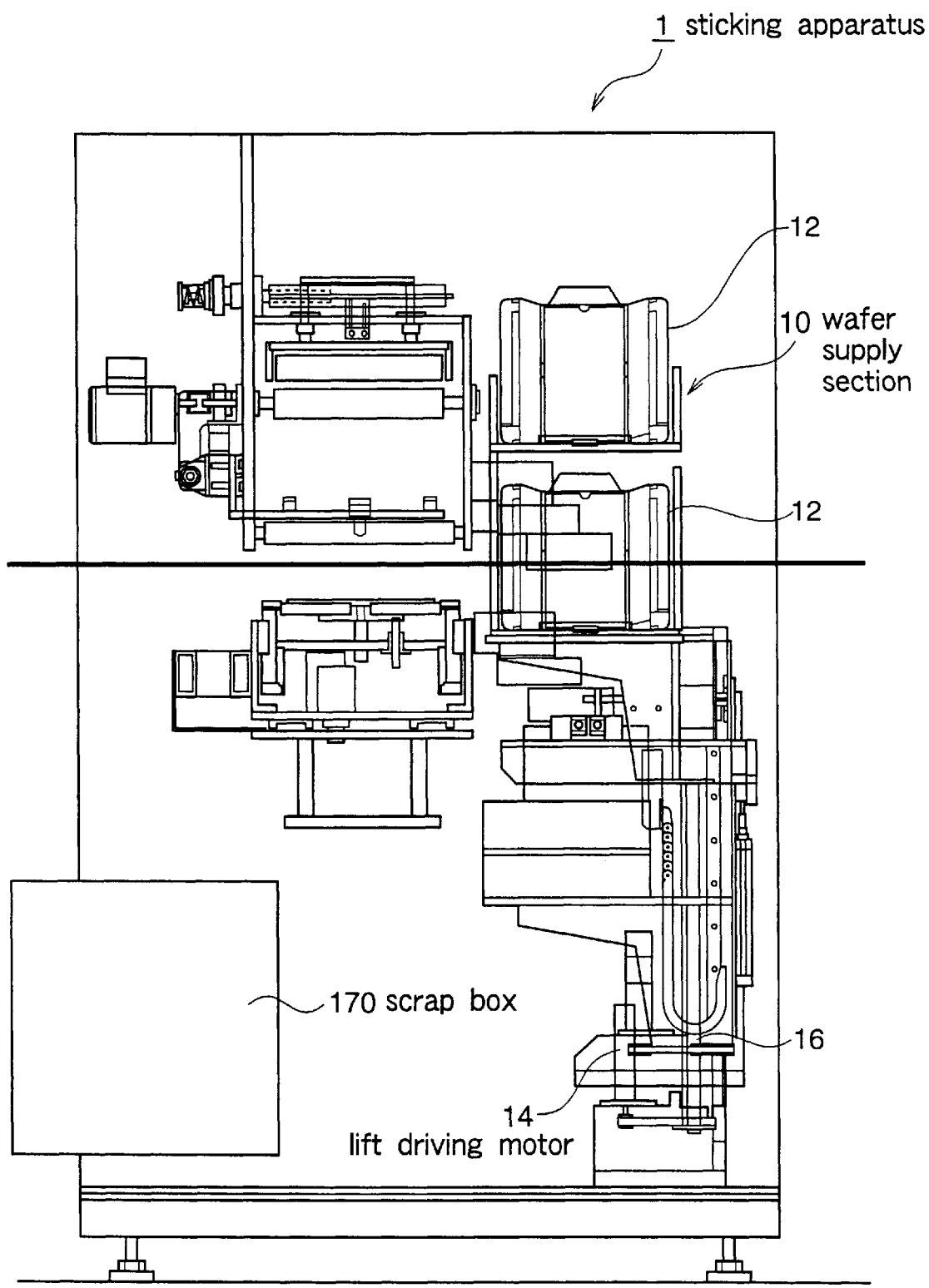
FIG. 3 is a side view of the die bonding sheet sticking apparatus of FIG. 1 taken in the direction of the arrow III of FIG. 1.

FIG. 1 is a plan view showing the entirety of one form of die bonding sheet sticking apparatus according to the present invention. FIG. 2 is a view of the die bonding sheet sticking apparatus of FIG. 1 taken in the direction of the arrow along the line II—II of FIG. 1. FIG. 3 is a side view of the die bonding sheet sticking apparatus of FIG. 1 taken in the direction of the arrow III of FIG. 1.

Referring to FIG. 1, numeral 1 generally designates one form of die bonding sheet sticking apparatus for semiconductor wafer (hereinafter simply referred to as "sticking apparatus 1") according to the present invention.

Figure 4:
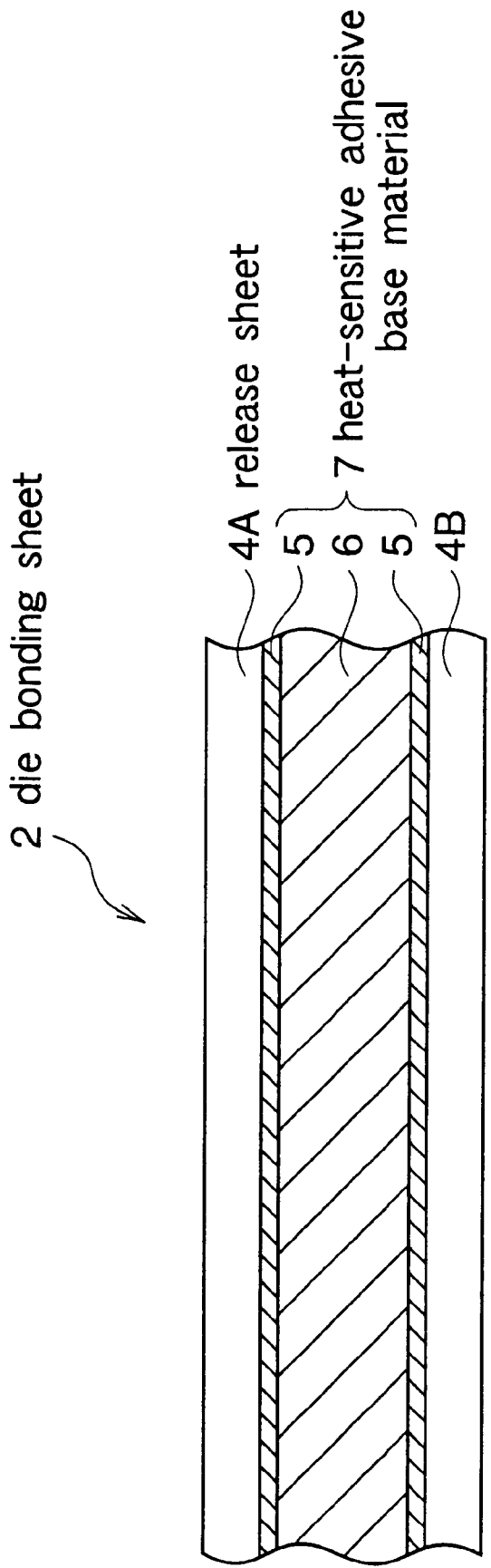
FIG. 4 is a partial enlarged sectional view of die bonding sheet for use in the present invention.

The sticking apparatus 1, referring to FIG. 1, includes wafer supply section 10 wherein a plurality of wafers W are accommodated, wafer conveyance section 20 which conveys wafers W accommodated in the wafer supply section 10, and alignment section 30 which positions the wafers W taken out from the wafer supply section 10 by the wafer conveyance section 20. The sticking apparatus 1 further includes sheet sticking section 40 for sticking a sheet (hereinafter referred to as "die bonding sheet 2") to back surface W3 (namely, surface not provided with a circuit pattern) of each of the wafers W having been positioned by the alignment section 30. This die bonding sheet 2 is produced by, as shown in FIG. 4, providing a base having heat-sensitive adhesive layers on its both sides (hereinafter referred to as "heat-sensitive adhesive base material 7") and superposing release sheets to the heat-sensitive adhesive layers. Still further, the sticking apparatus 1 includes sheet peeling section 50 which peels the release sheet 4 (4A) of the die bonding sheet 2 from the wafers W having the die bonding sheet 2 stuck thereto by the sheet sticking section 40.

With respect to the above die bonding sheet 2, it can be produced from, for example, a base 6 of a polyimide (PI) PET (polyethylene terephthalate) resin or the like and heat-sensitive adhesive layers 5 of a polyimide resin. Also, it can be produced from a heat-sensitive adhesive base material 7 of an epoxy resin and release sheets of PET (polyethylene terephthalate). In the present invention, the die bonding sheet 2 is not limited thereto, and any die bonding sheet 2 can be used as long as it comprises a base provided with heat-sensitive adhesive layers.

As shown in FIGS. 1 and 3, wafer carrier (wafer carry vessel) 12 or wafer supply box wherein wafers W are piled one upon another and accommodated (not shown) is detachably disposed in the wafer supply section 10 so as to be vertically movable by means of a driving unit composed of, for example, lift driving motor 14 and ball screw mechanism 16. The wafer carrier 12 in its inside is provided with a plurality of shelves having protrudent portions (not shown) on which a plurality of wafers W are accommodated. In FIG. 3, there are shown vertically arranged two wafer carriers 12 which are alternately used in order to continuously carry out the operation of the sticking apparatus 1.

Further, the wafer supply section 10 is provided with a wafer detecting sensor (for example, light transmission type or light reflection type sensor), not shown, so that, with respect to wafers W, the shelf position, number, etc. can be detected by the sensor while vertically moving the wafer carrier 12. In the wafer supply section 10, wafer supply box wherein wafers are piled one upon another with a cushion sheet for protecting the circuit surface interposed between neighboring wafers can be used.

As shown in FIG. 1, the wafer conveyance section 20 consists of a robot having a multiaxis (multishaft) mobile arm 22. This robot is so constructed that, by means of the mobile arm 22, the wafers W can be conveyed between with the wafer supply section 10, the alignment section 30, mount table 42 and the sheet peeling section 50 in the sequence of double headed arrows (1) to (4) indicated in FIG. 1.

The mobile arm 22 at its distal end is provided with suction member 24 which is connected to a vacuum source, not shown. Each wafer W can be fixed on the mobile arm 22 by negative pressure suction by means of the suction member 24.

The wafer conveyance section 20 of the above construction detects the shelf position, number, etc. with respect to wafers W accommodated in the wafer carrier 12 of the wafer supply section 10. The wafer conveyance section 20 is vertically moved depending on the detection results and takes out each wafer W accommodated on shelves in the wafer carrier 12, as indicated by double headed arrow (1) in FIG. 1, by effecting suction fixing thereof by means of the suction member 24 of the mobile arm 22.

Each wafer W taken out from the wafer supply section 10 with its circuit surface up is suction fixed on the suction member 24 provided on the distal end of the mobile arm 22, and transferred on turn table 32 of the alignment section 30 which conducts positioning of wafer W by means of the mobile arm 22 (as indicated by double headed arrow (2) in FIG. 1).

In the alignment section 30, a sensor, not shown, detects an orientation flat part consisting of a peripheral part formed into a straight line configuration or a V notch part provided on each wafer W, not shown, as a reference part while rotating the wafer W, and alignment (positioning) of the wafer W is effected on the basis of detection results.

After the completion of alignment in the alignment section 30, suction of the turn table 32 is canceled, and the wafer W is suction fixed on the mobile arm 22. Further, a reversing mechanism, not shown, provided in the mobile arm 22 turns the wafer W 180° upside down. The wafer W with its back surface up is conveyed to the mount table 42 of wafer heating sticking unit 45 of sheet sticking section 40 which sticks die bonding sheet 2 to the back surface of wafer W (as indicated by double headed arrow (3) in FIG. 1).

Figure 5:
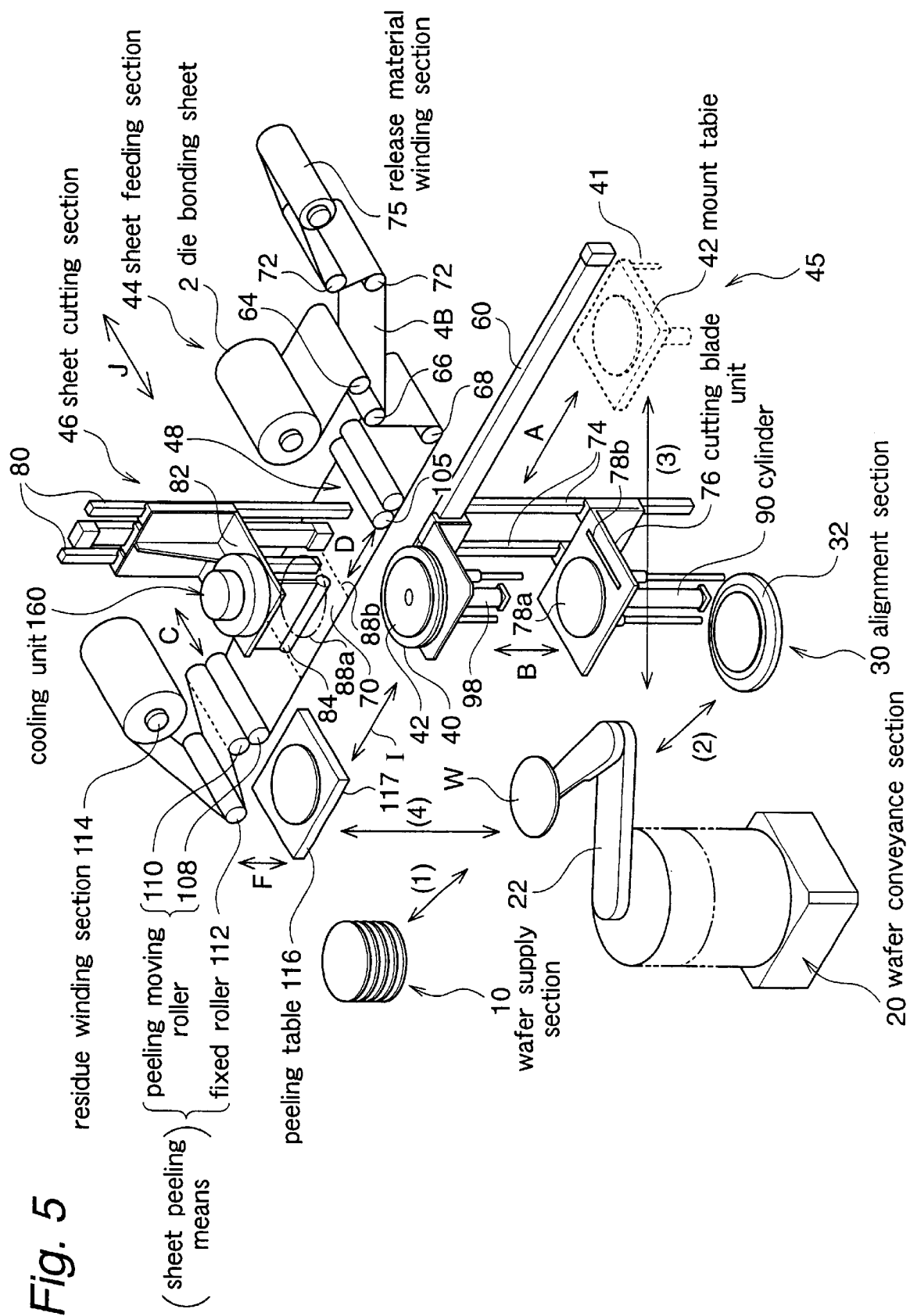
FIG. 5 is a schematic perspective view for explaining the action of die bonding sheet sticking apparatus according to the present invention.

The sheet sticking section 40, as shown in FIGS. 1, 2 and 5, includes the wafer heating sticking unit 45 which receives aligned wafer W having been conveyed by the mobile arm 22. Further, the sheet sticking section 40 includes sheet feeding section 44 which feeds die bonding sheet 2, sheet cutting section 46 which cuts the die bonding sheet 2 and sticking press section 48 which sticks the die bonding sheet 2 to the back surface of wafer W.

In the wafer heating sticking unit 45, the wafer w having been conveyed by the mobile arm 22 is transferred on the mount table 42 and held thereon by suction. The mount table 42 is so constructed that, as shown in FIGS. 1, 2 and 5, it can move between waiting position 41 (position where transfer of wafer W is effected; position indicated by dotted line in FIG. 5) and sticking position (position indicated by full line in FIG. 5) along guide rail 60, as indicated by double headed arrow A, by means of a driving mechanism such as cylinder mechanism, not shown.

In the sheet feeding section 44, the die bonding sheet 2 is wound round supply roller 62 as shown in FIGS. 2 and 5. The die bonding sheet 2 fed from the supply roller 62 is passed by means of guide roller 64, separating roller 66 and tension roller 68 arranged in this sequence to cutting/sticking position 70.

The release sheet 4B of die bonding sheet 2 is sharply folded back by the separating roller 66 with the result that the release sheet 4B is separated from the die bonding sheet 2. The separated release sheet 4B is guided by guide roller 72 and wound around release material winding section 75.

Upon the arrival of die bonding sheet 2 at the cutting/sticking position 70, at the sheet cutting section 46, cutting blade unit 76 (FIG. 9) which is so constructed as to be vertically movable along guide rail 74 ascends from under the die bonding sheet 2 as indicated by the double headed arrow B referring to FIG. 5. Thus, cutting blade 78a provided in conformity with the outline of wafer W and cutting blade 78b provided with a spacing of given distance L from the rear end of wafer W in the direction of conveyance of wafer W and arranged in the direction of width of the die bonding sheet 2, ascend to such a position that the cutting blades 78a, 78b are brought into contact with heat-sensitive adhesive base material 7 of the die bonding sheet 2.

Figure 6:
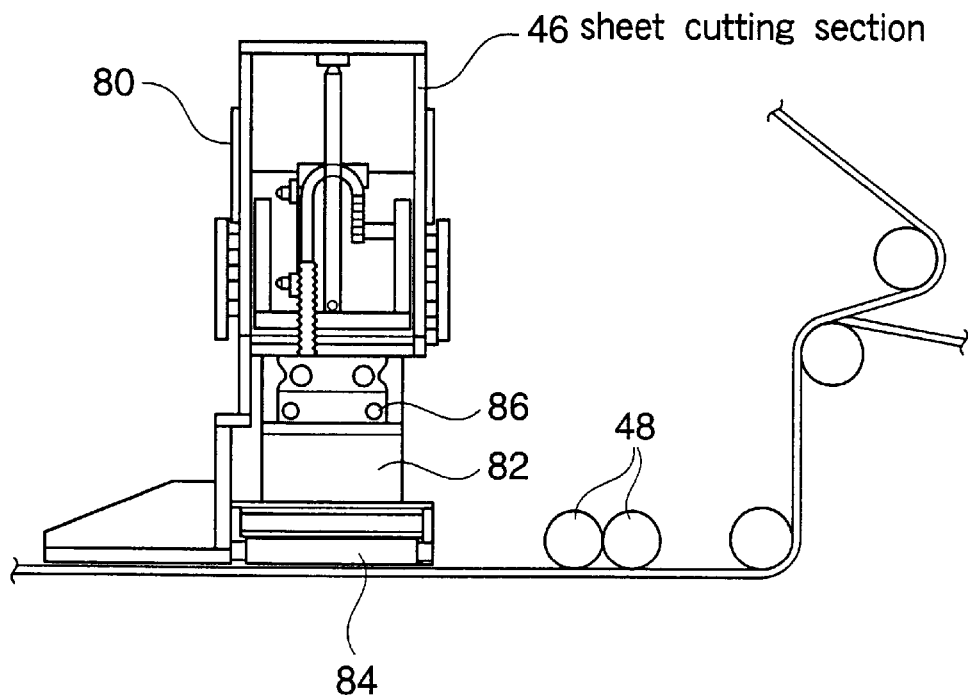
FIG. 6 is a front view of the sheet cutting section of die bonding sheet sticking apparatus according to the present invention.
Figure 7:
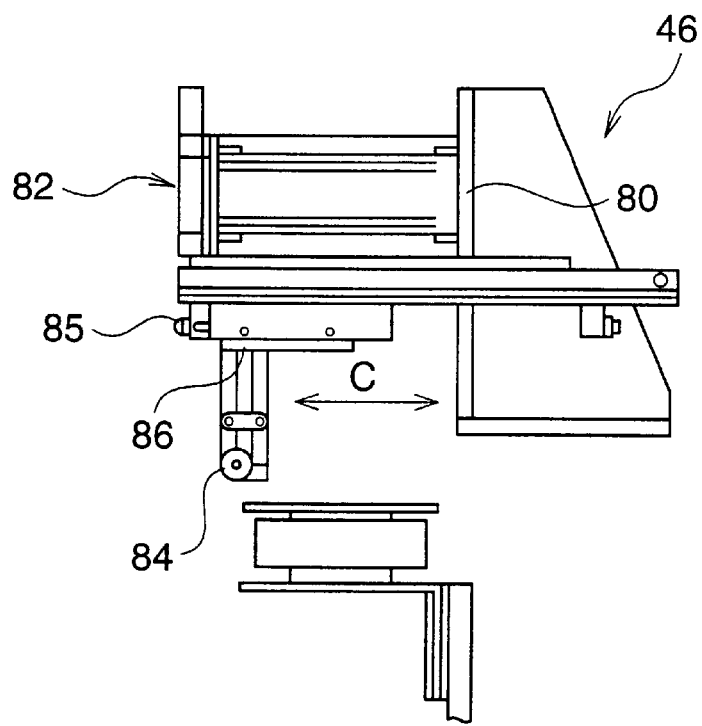
FIG. 7 is a side view of the sheet cutting section of FIG. 6.

At the same time, as shown in FIGS. 6 and 7, sheet cutting press unit 82 which is vertically movable along guide rail 80 moves downward, and cutting press roller 84 disposed under the sheet cutting press unit 82 moves along guide rail 86 in the direction C, namely, in the direction perpendicular to the direction of feeding of die bonding sheet 2. As a result, the die bonding sheet 2 is pressed downward from above the die bonding sheet 2, and the heat-sensitive adhesive base material 7 of the die bonding sheet 2 is cut by means of the cutting blade 78a in conformity with the outline of wafer W to thereby form cut 88a (FIGS. 9 and 11).

Figure 9:
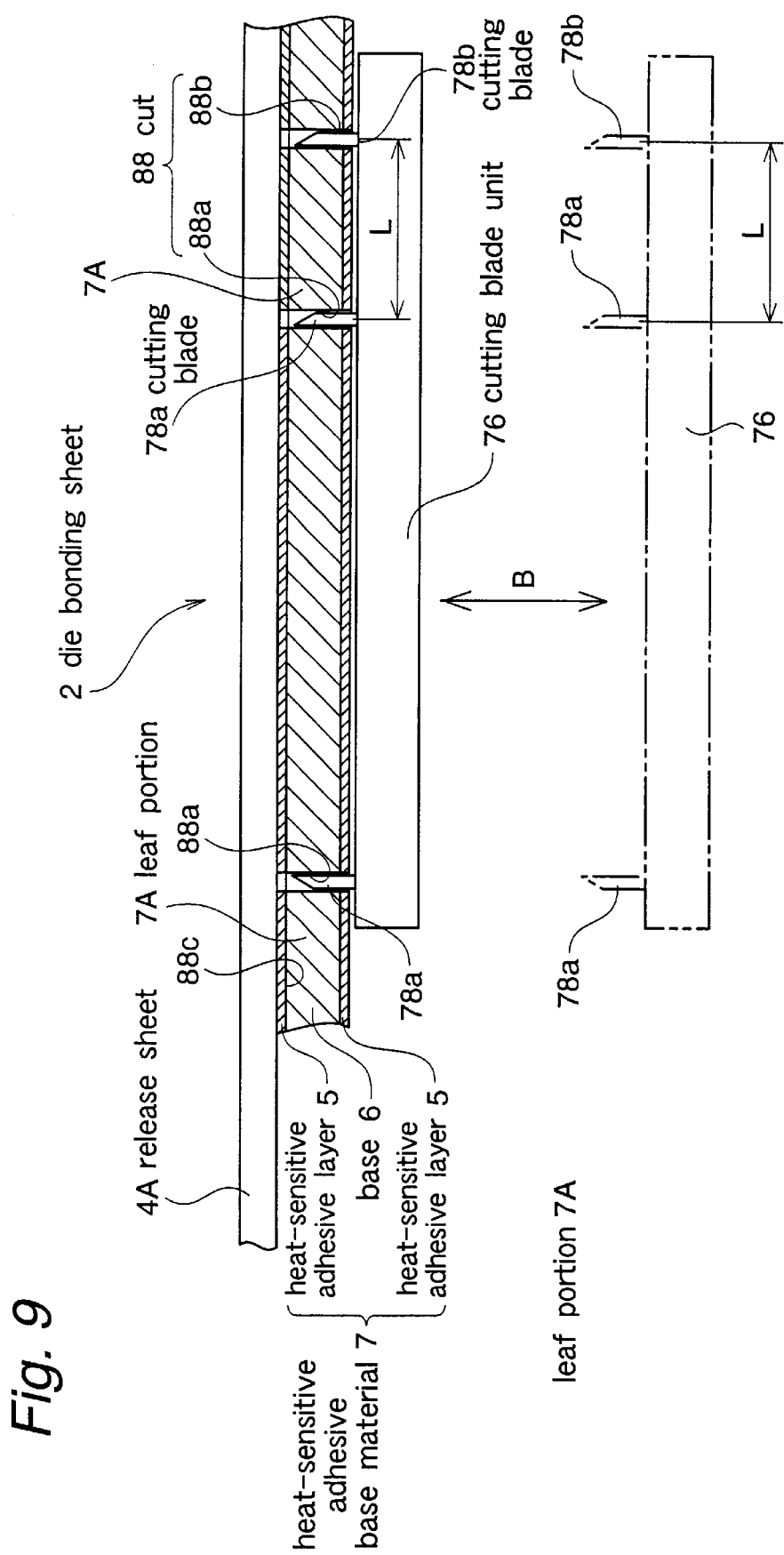
FIG. 9 is a schematic sectional view for explaining the action of the sheet cutting section of die bonding sheet sticking apparatus according to the present invention.
Figure 11:
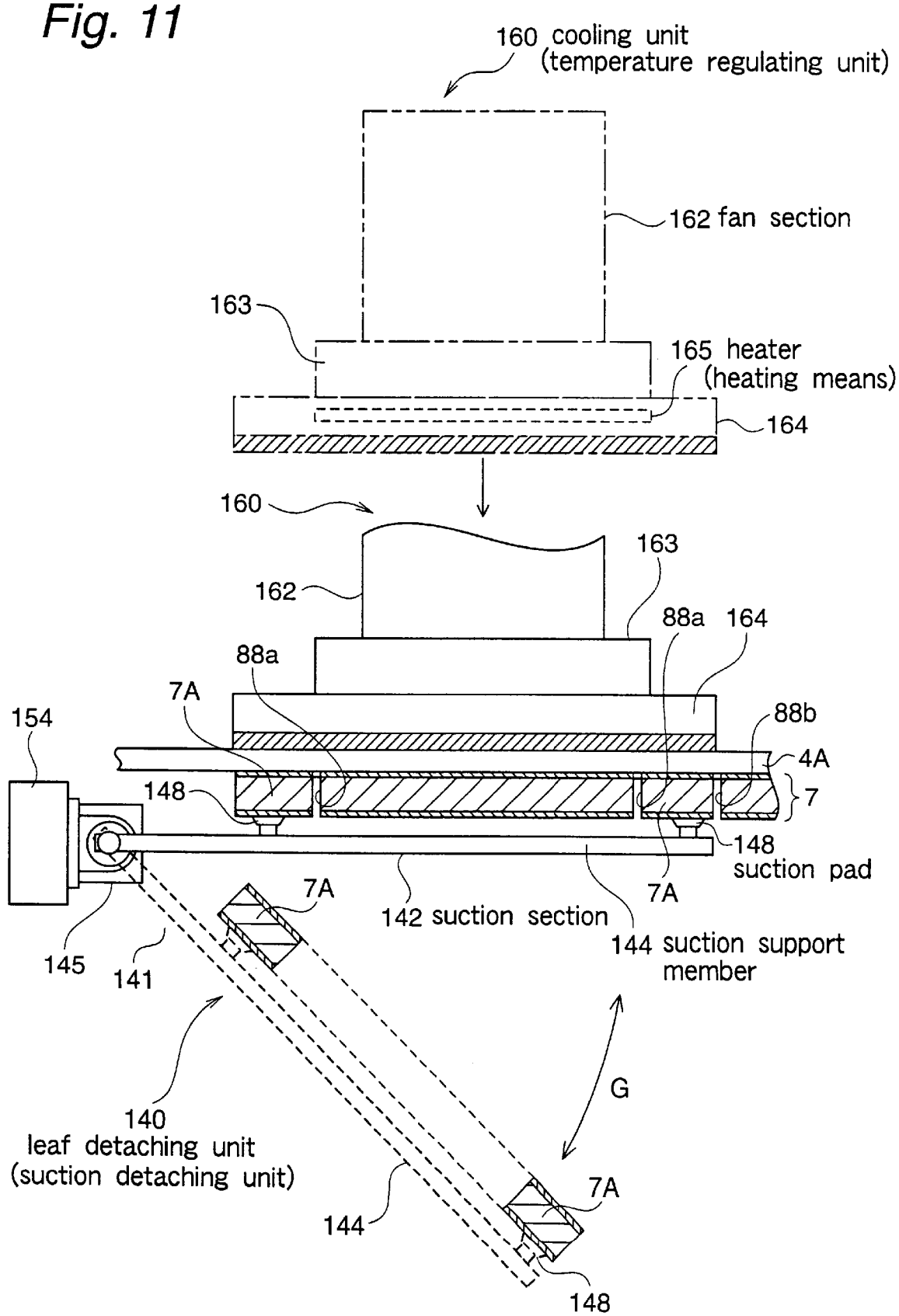
FIG. 11 is a schematic sectional view for explaining the action of detaching a leaf portion of die bonding sheet with the use of leaf detaching unit according to the present invention.

Also, at the same time, the heat-sensitive adhesive base material 7 of the die bonding sheet 2 is cut by means of the cutting blade 78b in the direction of width of the die bonding sheet 2 and with a spacing of given distance L from the rear end of wafer W in the direction of carrying of wafer W to thereby form cut 88b (FIGS. 9 and 11).

This given distance L is not particularly limited as long as it is easy to, as described later, detach leaf portion 7A, corresponding to portion outside the outline of wafer W, of base 6 provided with heat-sensitive adhesive layer 5 by means of leaf detaching unit 140.

For the accurate depth of these cuts 88a, 88b, the degree of lifting of the cutting blade unit 76 is regulated by driving of, for example, cylinder 90 or a servomotor.

Furthermore, at the same time, the mount table 42 is placed at the waiting position 41 (position indicated by dotted line in FIG. 5).

Upon providing the heat-sensitive adhesive base material 7 of die bonding sheet 2 with cut 88 in conformity with the outline of wafer W, the cutting blade unit 76 is moved downward. At the same time, the cutting press roller 84 is also returned to original position.

Figure 12:
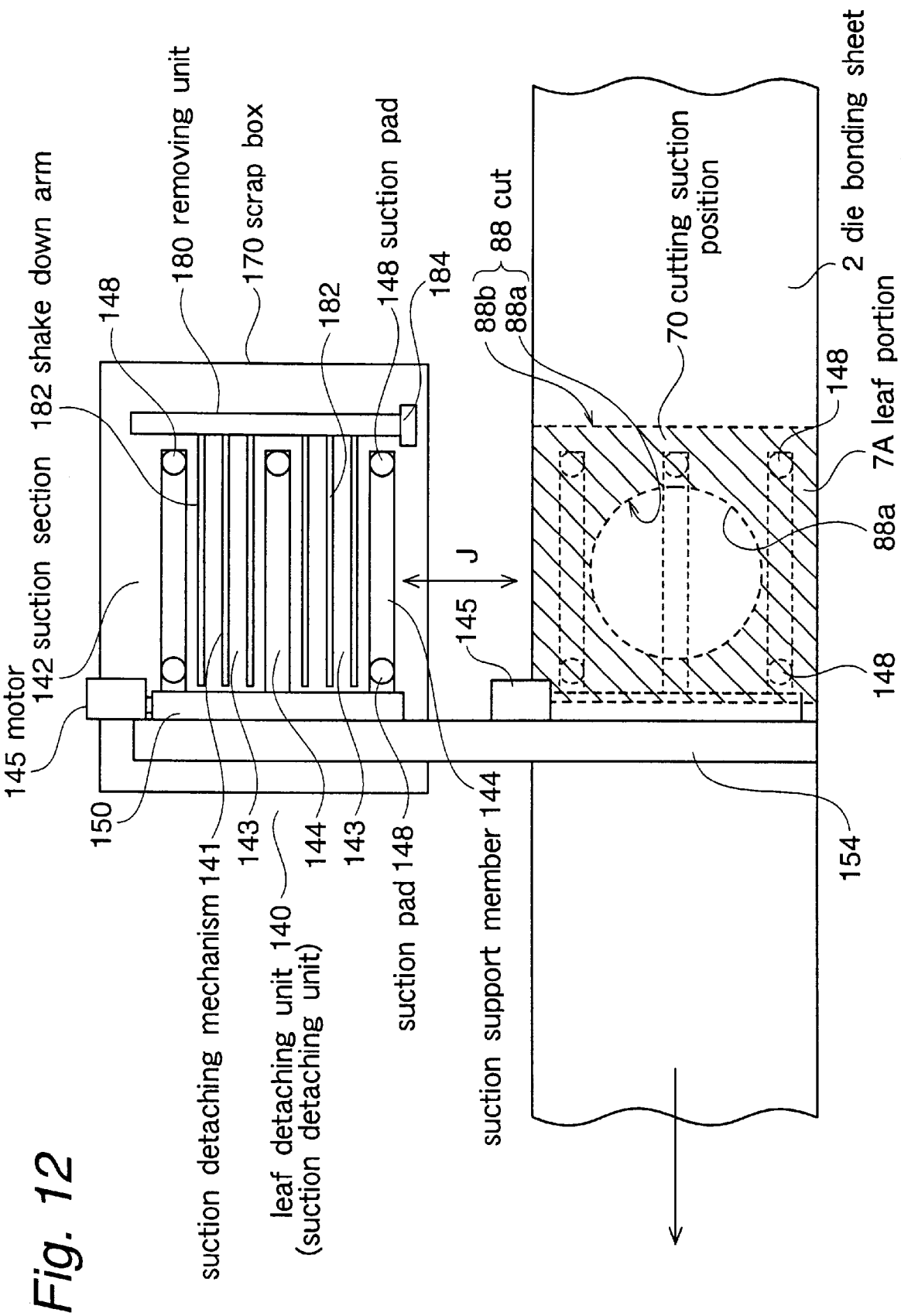
FIG. 12 is a schematic top view for explaining the action of detaching a leaf portion of die bonding sheet with the use of leaf detaching unit according to the present invention.

As shown in FIGS. 5, 11 and 12, the leaf detaching unit 140 moves to the cutting/sticking position 70.

This leaf detaching unit 140, as shown in FIGS. 11 and 12, includes suction detaching mechanism 141 and three comb-like suction support members 144 rotatably connected to the suction detaching mechanism 141, which are arranged to protrude upstream in the direction of conveyance of die bonding sheet 2 and are respectively provided with suction pads 148.

In this form of suction detaching mechanism 141, as shown in FIGS. 11 and 12, each of the suction support members 144 on both sides is provided with two suction pads 148 and the suction support member 144 in the middle is provided with one suction pad 148, and these suction pads 148 arranged in accordance with the configuration of the leaf portion 7A. As a result, the leaf portion 7A of die bonding sheet 2 formed by the cuts 88a, 88b, corresponding to portion outside the outline of wafer W, can be fixed to the suction pads 148 by negative pressure suction applied from thereunder.

By virtue of the providing of three suction pads 148 at distal ends of the suction-support members 144, when, as described later, the suction support members 144 of the leaf detaching unit 140 are rotated about rotation axle 150 in the direction of double headed arrow C so as to drift away from the die bonding sheet 2, detachment of the leaf portion 7A of base 6 corresponding to portion outside the outline of wafer W is initiated from the side of distal ends of suction support members 144. Thus, detachment from release sheet 4A can be easily accomplished.

With respect to the suction support members 144, the number of suction pads 148 and positions where the suction pads 148 are disposed are not particularly limited and can be appropriately set so as to facilitate the detachment of the leaf portion 7A from the release sheet 4A.

The suction support members 144, as shown in FIG. 11, can be rotated about rotation axle 150 in the direction of double headed arrow G so as to have access to or drift away from the die bonding sheet 2 by driving of motor for vertical movement 145.

The suction detaching mechanism 141 is so constructed that, as shown in FIGS. 1, 11 and 12, it is movable vertically by driving of the motor for vertical movement 145. Furthermore, as shown in specifically to FIGS. 1 and 12, the suction detaching mechanism 141 can be moved in access or moving away direction between the cutting/sticking position 70 and scrap box 170 by means of slider 154.

In the thus constructed leaf detaching unit 140, as shown in FIGS. 11 and 12, the suction detaching mechanism 141 is moved from the scrap box 170 to the cutting/sticking position 70, by means of slider 154.

In this condition, the suction support members 144 are rotated about the rotation axle 150 in the direction of double headed arrow G so as to have access to the die bonding sheet 2 by driving of the motor 145. Consequently, as shown in FIG. 11, the suction pads 148 of the suction support members 144 are brought into contact with the die bonding sheet 2. As a result, the leaf portions 7A of die bonding sheet 2 formed by the cuts 88a, 88b, corresponding to portion outside the outline of wafer W, are fixed to the suction pads 148 by negative pressure suction applied from thereunder.

At this stage, as shown in FIGS. 2, 5 and 11, cooling unit 160 (temperature regulating unit) is moved downward by means of a lift unit, not shown, until it is brought into contact with the release sheet 4A of die bonding sheet 2. This cooling unit 160 includes fan section 162 and contact section 164, including radiation shield 163 and a porous soft member such as a sponge. This cooling unit 160 is adapted to be brought into contact with the release sheet 4A of die bonding sheet 2.

In this embodiment of the present invention, the cooling unit 160 is used as a temperature regulating unit. This cooling unit 160 can be set for any arbitrary temperature within the range of 5 to 50° C., depending on the set temperature of a temperature regulator, not shown. The cooling unit 160 is automatically controlled at the set temperature of the temperature regulator. In this embodiment, the temperature is set for 23° C.

For example, when the base 6 provided with heat-sensitive adhesive layer 5 is constituted of an epoxy resin while the release sheet 4A is constituted of polyethylene terephthalate (PET), the peeling of the leaf portion 7A formed by the cuts 88a, 88b as a result of cutting by the cutting blades 78a, 78b of the cutting blade unit 76 is difficult. Because the base 6 provided with heat-sensitive adhesive layer 5 tends to be fusion bonded to the release sheet 4A because of a rise of ambient temperature in the apparatus which is caused by heating from means of, for example, a heating unit for effecting fusion bonding of the heat-sensitive adhesive layer 5 to the wafer W.

However, the cooling to given temperature by means of the cooling unit 160 (temperature regulating unit) according to the present invention enables avoiding any increase of bonding strength between the base 6 and the release sheet 4A even if the ambient temperature inside the apparatus is increased. Thus, as described later, the peeling of the leaf portion 7A, corresponding to portion outside the outline of wafer W, of the base 6 provided with heat-sensitive adhesive layer 5 by means of the leaf detaching unit 140 can be easily accomplished.

In this embodiment of the present invention, as the cooling unit 160, an electronic cooler including a Peltier module wherein heater 165 is housed in the contact section 164 of the cooling unit 160 is used so that a temperature regulating unit capable of both cooling and heating can be provided. However, other temperature regulating units can also be used as long as like effects can be exerted.

With respect to the temperature of die bonding sheet 2 attained by cooling with the use of the above cooling unit 160, the portion of die bonding sheet 2 brought into contact with the cooling unit 160 preferably comes to have a temperature ranging from 19 to 25° C., still preferably from 21 to 23° C., depending on the type of material of die bonding sheet 2.

While the cooling is effected with the use of the cooling unit 160, the suction support members 144 of the leaf detaching unit 140 are rotated by driving of the motor 145 about the rotation axle 150 in the direction of double headed arrow G so as to drift away from the die bonding sheet 2.

As a result, as shown in FIG. 11, the leaf portion 7A, corresponding to portion outside of the outline of wafer W, of the base 6 provided with heat-sensitive adhesive layer 5 is detached from the release sheet 4A.

Thereafter, by driving of the motor 150 for vertical movement, the suction support members 144 are moved in the direction wherein the suction support members 144 further drift away from the die bonding sheet 2. At the same time, the cooling unit 160 is also lifted by a lift unit, not shown, and moved in the direction wherein it parts (lifts) from the release sheet 4A of die bonding sheet 2.

As shown in FIGS. 1 and 12, the suction detaching mechanism 141 is moved by means of the slider 154 in the direction wherein the suction detaching mechanism 141 parts from the cutting/sticking position 70 until the suction detaching mechanism 141 is positioned above the scrap box 170.

Removing unit 180 which removes the leaf portion 7A, corresponding to portion outside the outline of wafer W, having been detached by means of the leaf detaching unit 140 from the leaf detaching unit 140 is disposed above the scrap box 170.

Figure 13:
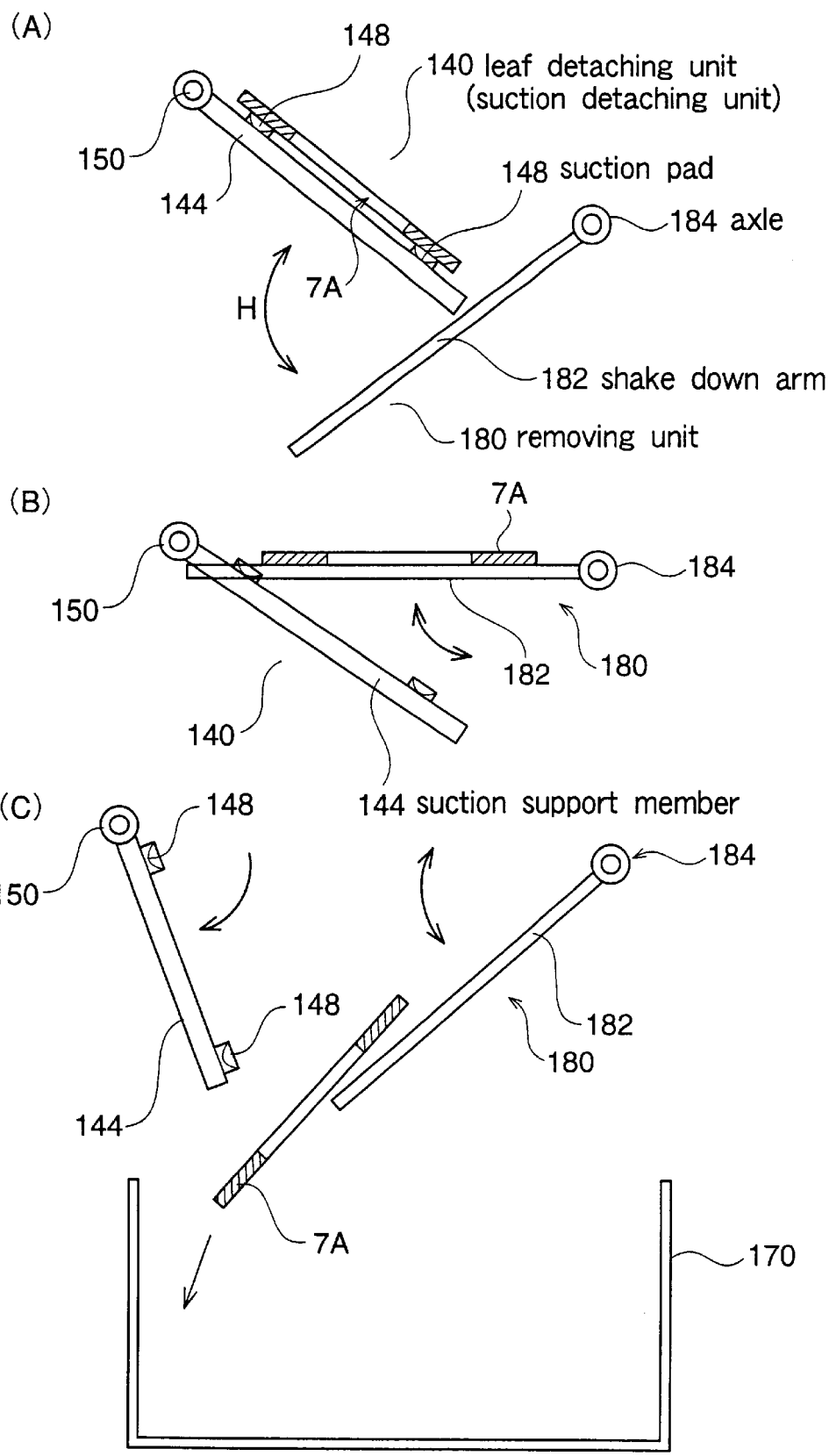
FIG. 13 is a schematic sectional view for explaining the action of scrapping a leaf portion of die bonding sheet with the use of removing unit according to the present invention.
Figure 14:
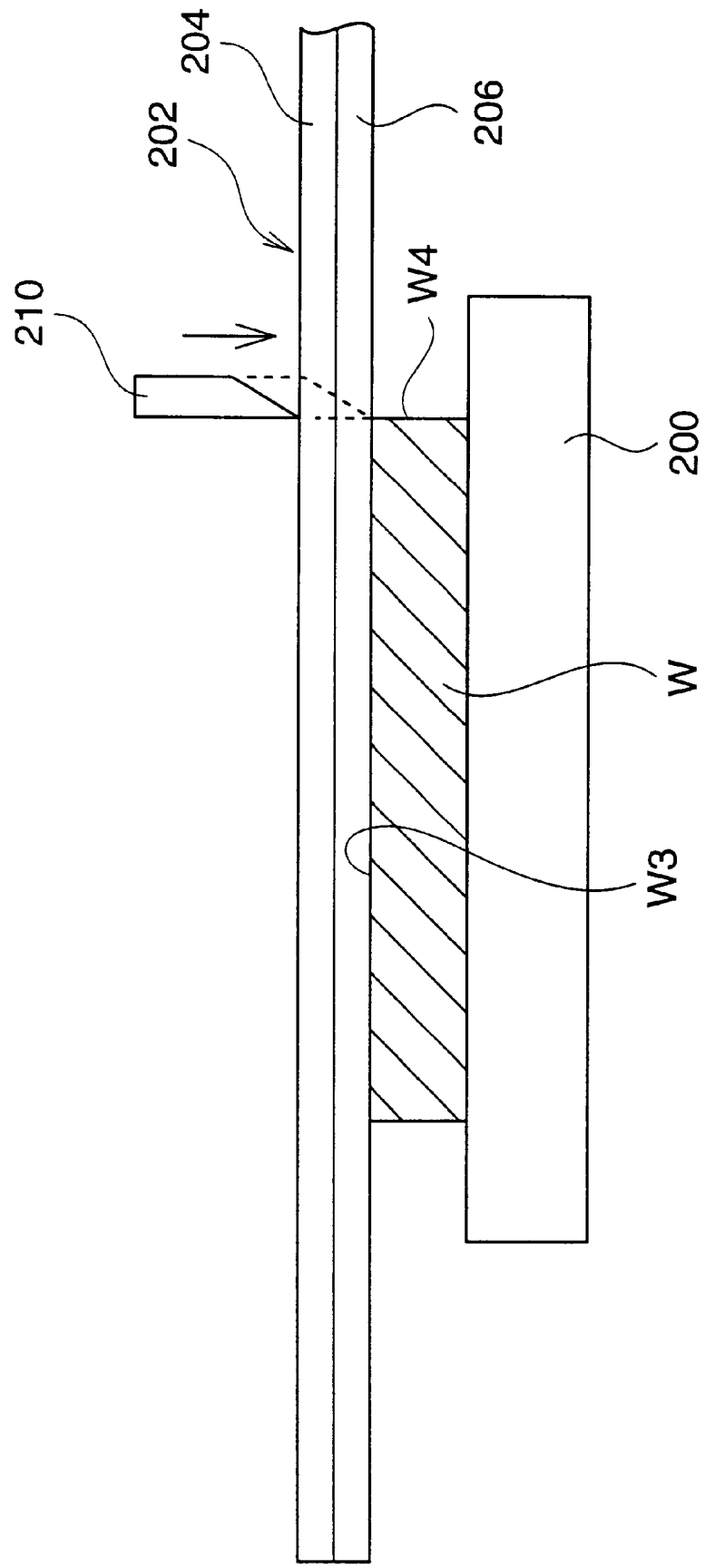
FIG. 14 is a schematic sectional view for explaining the method of sticking the conventional pressure sensitive adhesive sheet.

This removing unit 180 is provided with a plurality of shake down arms 182, like the teeth of a comb, which are spaced from each other with a given distance and which can be inserted in interstices 143 of the suction support members 144 of the leaf detaching unit 140. These shake down arms 182 are so constructed as to be rotatable by means of a driving unit, not shown, about rotation axle 184 in the direction of double headed arrow H as shown in FIG. 13.

Therefore, when the leaf portion 7A fixed by suction to the suction pads 148 of the suction detaching mechanism 141 having been moved and positioned above the scrap box 170 is discarded, the negative pressure suction of the suction pads 148 is canceled.

Then, as shown in FIG. 13(A), the shake down arms 182 of the removing unit 180 are rotated about the rotation axle 184 in the direction of double headed arrow H upward from thereunder. As a result, the plurality of shake down arms 182, like the teeth of a comb, are inserted in interstices 143 of the suction support members 144 of the leaf detaching unit 140 from thereunder. Thus, the leaf portion 7A is transferred onto the shake down arms 182.

Consequently, the leaf portion 7A is removed from the suction pads 148 of the leaf detaching unit 140, and delivered onto the shake down arms 182 of the removing unit 180 (FIG. 13(B)). Subsequently, as shown in FIG. 13(C), the suction support members 144 are rotated downward and the shake down arms 182 are rotated about the rotation axle 184 in the direction of double headed arrow H downward. As a result, the leaf portion 7A having been delivered to the shake down arms 182 are discarded into the scrap box 170 by gravity or by application of, for example, air, not shown.

In the above manner, the leaf portion 7A, corresponding to portion outside the outline of wafer W, of the base 6 provided with heat-sensitive adhesive layer 5 is removed from the die bonding sheet 2.

In this condition, the mount table 42 placed at the waiting position 41 (position indicated by dotted line in FIG. 5) is moved to the cutting/sticking position 70 (position indicated by full line in FIG. 5) as indicated by the double headed arrow A in FIG. 5.

Figure 8:
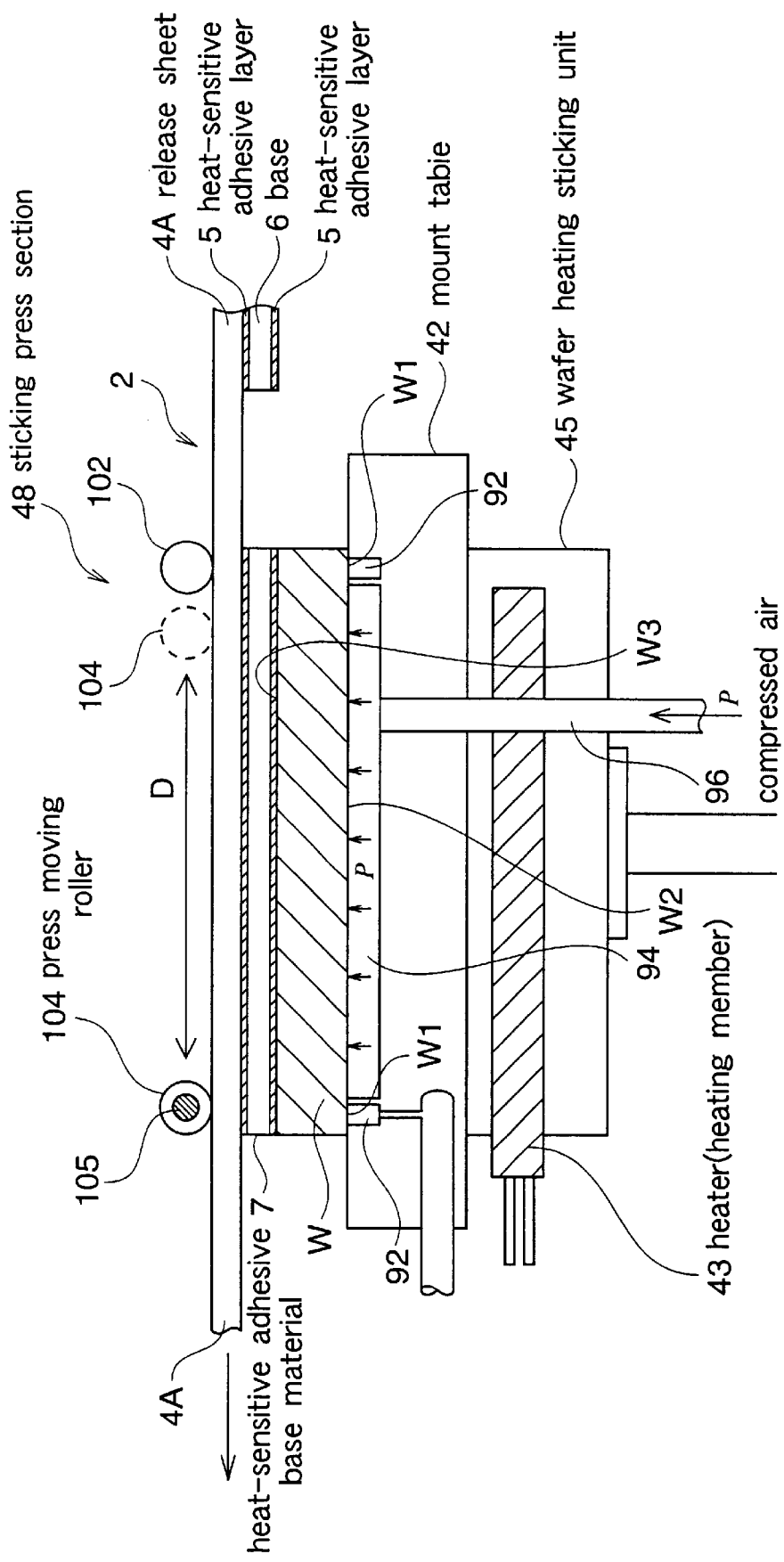
FIG. 8 is a schematic sectional view for explaining the action of the sticking press section of die bonding sheet sticking apparatus according to the present invention.

The mount table 42, as shown in FIG. 8, protrudes upward at a peripheral portion thereof, and, at the protrusion, there is provided suction part 92 adapted to fix peripheral portion W1 of the surface of wafer W by suction. Also, there is provided air blow space part 94 which is surrounded by the suction part 92.

The suction part 92 is provided with a width of about 3 mm as measured from the circumference of wafer W, so that it is brought into contact with portion of wafer W not overlaid with the circuit pattern. Therefore, the suction part 92 has no influence on the circuit pattern of wafer W. This suction part 92 is connected to a vacuum source, not shown, and is so constructed as to fix the peripheral portion W1 of wafer W by negative pressure suction.

Compressed air P of constant pressure is fed through air supply pipe 96 connected to an air supply source, not shown, to the air blow space part 94, so that the entirety of surface W2 of wafer W is supported upward at a constant pressure (arrow P of FIG. 8).

In this condition, the mount table 42 is moved to the cutting/sticking position 70 (position indicated by full line in FIG. 5), where, as shown in FIG. 8, back surface W3 (namely, surface not provided with the circuit pattern) of wafer W is brought into contact with the heat-sensitive adhesive base material 7 of die bonding sheet 2 provided with cut 88 in conformity with the outline of wafer W. The accurate position of back surface W3 of wafer W is controlled by regulating the degree of lifting of the mount table 42 by driving of cylinder 98 with the use of a control unit, not shown.

The mount table 42 is provided with heater 43, so that the heat-sensitive adhesive layer 5 of die bonding sheet 2 is heated through the wafer W to thereby increase the adherence thereof. The temperature, although depending on the type of heat-sensitive adhesive, is set for one not detrimental to the performance of the wafer W.

In this condition, the die bonding sheet 2 is pressed downward from above the die bonding sheet 2 by the sticking press section 48, so that the heat-sensitive adhesive base material 7 of die bonding sheet 2 is stuck to the back surface W3 of wafer W placed on the mount table 42.

Specifically, as shown in FIGS. 2, 5, 6 and 8, the sticking press section 48 comprises fixed roller 102 and press moving roller 104 arranged downstream of the fixed roller 102. The fixed roller 102 retains the die bonding sheet 2 at a position upstream of the wafer W, and the press moving roller 10, while pressing the die bonding sheet 2 downward from thereabove, is moved downstream in the direction of double headed arrow D of FIG. 8. Consequently, the heat-sensitive adhesive base material 7 of die bonding sheet 2 is stuck to the back surface W3 of wafer W (FIG. 8).

By virtue of the retaining of die bonding sheet 2 at a position upstream of wafer W by the fixed roller 102 and the downstream moving of the press moving roller 104, any air between the back surface W3 of wafer W and the heat-sensitive adhesive base material 7 of die bonding sheet 2 is expelled from the downstream side. Therefore, trapping of air between the back surface W3 of wafer W and the heat-sensitive adhesive base material 7 of die bonding sheet 2 can be avoided. As a result, sticking of the heat-sensitive adhesive base material 7 of die bonding sheet 2 to the back surface W3 of wafer W is ensured.

The press moving roller 104 is provided with heating unit 105. Therefore, the die bonding sheet 2 can be further heated by the heating unit 105 of the press moving roller 104 to thereby enable easily and securely sticking the base 6 provided with heat-sensitive adhesive layer 5 to the back surface W3 of wafer W.

At this sticking, the entirety of surface W2 of wafer W is supported upward by air. Therefore, the downward pressing by the press moving roller 104 of the sticking press section 48 for sticking the die bonding sheet 2 can be free from cracking, breaking or damaging of wafer W.

After the sticking of the heat-sensitive adhesive base material 7 of die bonding sheet 2 to the back surface W3 of wafer W by the sticking press section 48 is accomplished, the suction for the suction part 92 of the mount table 42 is canceled. Furthermore, the mount table 42 is moved to the cutting/sticking position 70 (position indicated by full line in FIG. 5) to the waiting position 41 (position indicated by dotted line in FIG. 5). Once more, new wafer W having been aligned by the alignment section 30 is conveyed onto the mount table 42 by means of the mobile arm 22 of the wafer conveyance section 20.

On the other hand, while the precut heat-sensitive adhesive base material 7 of die bonding sheet 2 is in the state of being stuck to the back surface W3 of wafer W, the release sheet 4A of die bonding sheet 2 is peeled from the wafer W having precut portion of heat-sensitive adhesive base material 7 of die bonding sheet 2 stuck thereto at the cutting/sticking position 70.

Figure 10:
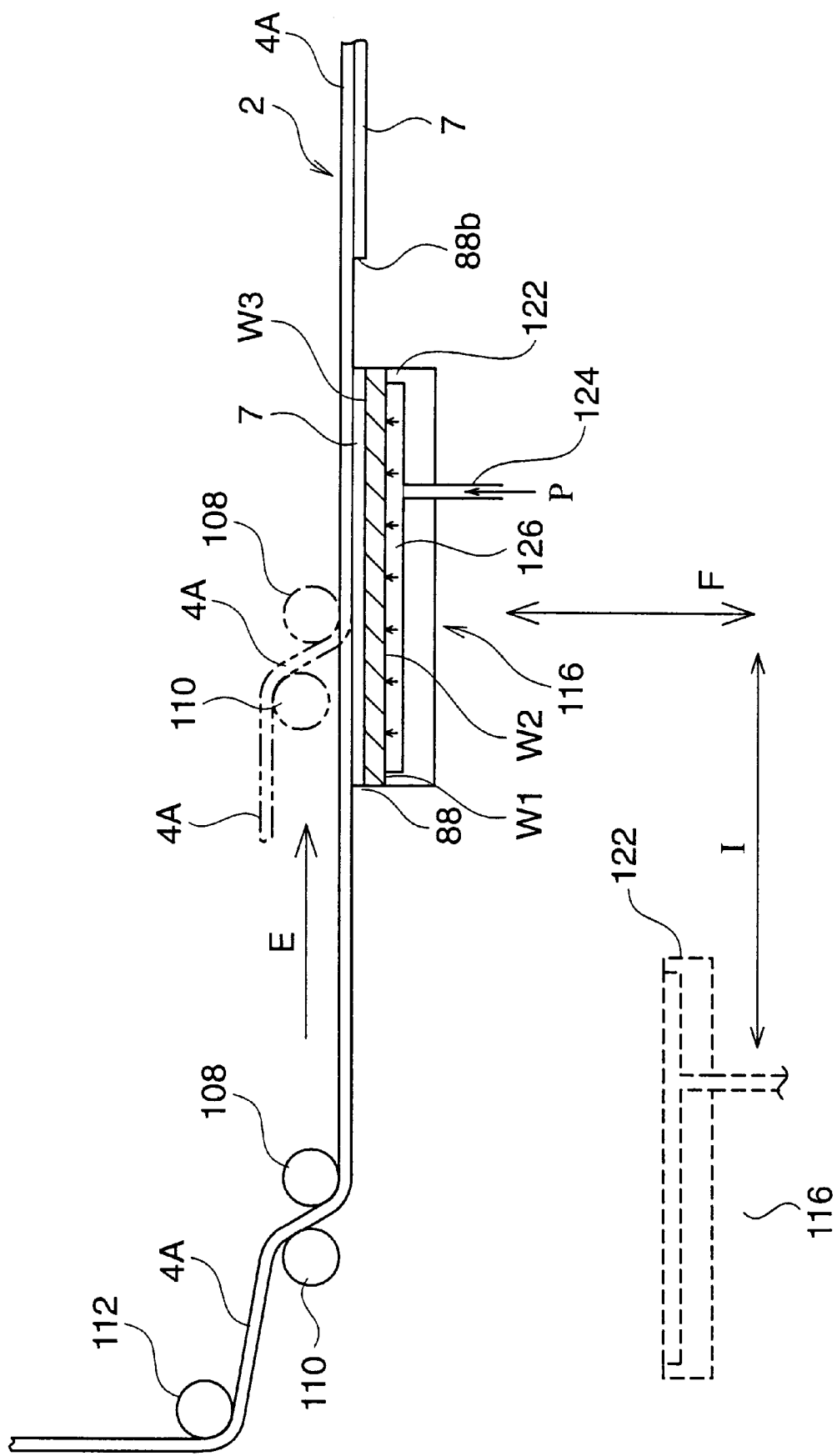
FIG. 10 is a schematic sectional view for explaining the action of the sheet peeling section of die bonding sheet sticking apparatus according to the present invention.

Specifically, as shown in FIGS. 2 and 10 showing sheet detaching means, the release sheet 4A is wound around and sandwiched between a pair of peeling moving rollers 108, 110, guided by fixed roller 112, and taken up by residue winding roller 114.

Further, as shown in FIGS. 1, 2 and 5, there is provided peeling table 116 of substantially the same construction as that of the mount table 42 of the sheet sticking section 40. The peeling table 116 is so constructed as to be movable not only vertically (direction F) along guide rail 118 by means of a driving mechanism such as cylinder mechanism 120 but also in the direction of double headed arrow I by means of slider mechanism 119.

Specifically, the peeling table 116 protrudes upward at a peripheral portion thereof, and includes suction part 122 adapted to fix peripheral portion W1 of the surface of wafer W by suction and air blow space part 126 which is surrounded by the suction part 122. The air blow space part 126 is adapted to support the surface W2 of wafer W upward from thereunder by compressed air P fed through air supply pipe 124. This peeling table 116, however, is provided with no heater.

Thus, by means of a driving mechanism not shown, the peeling table 116 is moved from waiting position 117 to the cutting/sticking position 70 as indicated by the double headed arrow I in FIGS. 2 and 5.

Then, as shown in FIG. 10, while the heat-sensitive adhesive base material 7 of die bonding sheet 2 is stuck to the back surface W3 of wafer W, the detaching table 116 is lifted in the direction of double headed arrow F of FIG. 10 toward the die bonding sheet 2. As a result, the suction part 122 of the peeling table 116 fixes the peripheral portion W1 of wafer W by suction. Then, compressed air P is fed at a constant pressure through the air supply pipe 124 connected to an air supply source, not shown, so that the entirety of surface W2 of wafer W is supported upward at a constant pressure.

In this condition, the pair of peeling moving rollers 108, 110 as sheet peeling means are moved upstream as indicated by the arrow E in FIG. 10, so that the release sheet 4A sandwiched between the pair of peeling moving rollers 108, 110 is peeled from the heat-sensitive adhesive base material 7 with cut (precut) 88 and in the state of being stuck to the back surface W3 of wafer W. The peeled release sheet 4A is guided by the fixed roller 112, and taken up by the residue winding roller 114.

At this peeling, the entirety of surface W2 of wafer W is supported upward by compressed air P. Therefore, the above peeling of release sheet 4A of die bonding sheet 2 is free from cracking, breaking or damaging of wafer W.

After the completion of peeling operation, the peeling table 116 descends in the direction of double headed arrow F of FIG. 10, and the suction for the suction part 122 is canceled.

Thereafter, the wafer W is fixed on the mobile arm 22 by suction and accommodated on shelves in the wafer carrier 12 of the wafer supply section 10. Alternatively, the wafers W are accommodated in a wafer accommodating box for accommodating wafers W, not shown, by piling them one upon another, while laying cushion sheets for protecting the circuit surface therebetween, the wafer accommodating box.

At the same time, the peeling table 116 is returned from the cutting/sticking position 70 to the waiting position 117.

In this embodiment of the present invention, the heat-sensitive adhesive base material 7 has been cooled by the use of the cooling unit 160. However, when the ambient temperature in the apparatus is low, or when it is intended to increase a peeling effect by heating the base, heating to a given temperature can also be effected by a built-in heater of the cooling unit 160 in accordance with the set temperature of a temperature regulator, not shown.

The above cycle of operation is repeated.

The resultant wafer W with back surface W3 to which the heat-sensitive adhesive base material 7 of die bonding sheet 2 has been stuck is subjected to a series of steps, for example, including dicing operation, washing, drying and die bonding.

The present invention enables continuously and automatically carrying out a series of operations including taking out a wafer from a wafer cassette wherein a plurality of wafers are accommodated, alignment for positioning the wafer, peeling the release sheet of a die bonding sheet comprising a release sheet and a base provided with heat-sensitive adhesive layer, sticking the base provided with heat-sensitive adhesive layer to the back of the wafer, and accommodating the wafer stuck thereto in a wafer cassette.

The die bonding sheet also functions as an adhesive for die bonding at the die bonding of semiconductor chips to a lead frame after dicing, because the die bonding sheet comprises a release sheet and a base provided with heat-sensitive adhesive layer.

Therefore, as different from the prior art, it is not needed to apply an adhesive to a lead frame at the time of die bonding. In the present invention, at the time of die bonding, only heating the die bonding sheet enables not only picking up, by suction, semiconductor chips with the use of suction collets but also direct thermocompression bonding because the base provided with heat-sensitive adhesive layer of the die bonding sheet also functions as an adhesive for a lead frame.

Further, the base provided with heat-sensitive adhesive layer of the die bonding sheet is cut (precut) in conformity with the outline of wafer before the base provided with heat-sensitive adhesive layer of the die bonding sheet is stuck to the back surface of the wafer. Therefore, there is no danger of flawing of a peripheral portion of wafer or wafer cracking as experienced at the cutting of die bonding sheet with a cutter in the prior art. Also, as different from the prior art, it is not needed to cut the die bonding sheet by a separate operation in advance.

Still further, prior to the sticking of the die bonding sheet to the back surface of the wafer, only a leaf portion, corresponding to portion outside the outline of wafer, of the base provided with heat-sensitive adhesive layer of the die bonding sheet after cutting with cutting means is detached by the use of leaf detaching means. Therefore, at the sticking of heated wafer back surface to the die bonding sheet, any fusion bonding between an outline portion of the wafer and the leaf portion corresponding to portion outside the outline of wafer can be avoided. Consequently, the release sheet of the die bonding sheet can be easily detached, without any hindrance, from the wafer.

Moreover, the apparatus of the present invention includes a temperature regulating unit which cools the die bonding sheet from its release sheet side at the time of detaching only the leaf portion corresponding to portion outside the outline of wafer. For example, when, like the case where the base provided with heat-sensitive adhesive layer is constituted of an epoxy resin while the release sheet is constituted of polyethylene terephthalate (PET), the adherence between the base provided with heat-sensitive adhesive layer and the release sheet is increased with the rise of ambient temperature in the apparatus which is caused by, for example, a wafer heating unit in the apparatus, it would become difficult to peel the release sheet from the base provided with heat-sensitive adhesive layer unless no countermeasure is taken.

However, the peeling of the release sheet from the base provided with heat-sensitive adhesive layer can be accomplished without an increase of adherence therebetween by effecting the cooling to given temperature by means of the temperature regulating unit according to the present invention. As a result, only the leaf portion, corresponding to portion outside the outline of wafer, of the base provided with heat-sensitive adhesive layer can be easily peeled. Furthermore, when, depending on the type of material of the base provided with heat-sensitive adhesive layer, heating must be effected at the above peeling, the peeling can be accomplished while heating at set temperature by means of a built-in heater of the temperature regulating unit through setting a temperature regulator for given temperature. As apparent from the foregoing, the present invention can exert various unique and striking functions and effects and is highly advantageous.

What is claimed is:

1. A die bonding sheet sticking apparatus including:
   a wafer supply section for accommodating a plurality of wafers therein,
   a wafer conveyance section including conveyance means for taking out a wafer from the wafer supply section and conveying the wafer,
   an alignment section for positioning the wafer taken out from the wafer supply section via the wafer conveyance means of the wafer conveyance section,
   a sheet sticking section for conveying the wafer arranged for given reference position at the alignment section via conveying means and for sticking a die bonding sheet to a back surface of the wafer by heating, said die bonding sheet comprising a release sheet and a base provided with heat-sensitive adhesive layer, and
   a sheet peeling section including sheet peeling means for peeling the release sheet of the die bonding sheet from the wafer having the die bonding sheet stuck thereto at the sheet sticking section, wherein the sheet sticking section comprises:
cutting means capable of, prior to the sticking of the die bonding sheet to the back surface of the wafer, cutting the base provided with heat-sensitive adhesive layer of the die bonding sheet in conformity with an outline of the wafer, said cutting means capable of cutting the base provided with heat-sensitive adhesive layer in the direction of a width of the die bonding sheet with a spacing of given distance from a rear end portion of the wafer in the direction of conveyance of the wafer so as to form a leaf portion; and leaf detaching means capable of, prior to the sticking of the die bonding sheet to the back surface of the wafer, detaching only the leaf portion, corresponding to portion outside the outline of the wafer, of the base provided with heat-sensitive adhesive layer of the die bonding sheet after the cutting by said cutting means.

2. The die bonding sheet sticking apparatus as claimed in claim 1, wherein the cutting means comprises:

a cutting blade unit including a cutting blade shaped in conformity with the outline of the wafer and a cutting blade provided in the direction of a width of the die bonding sheet with a spacing of given distance from a rear end portion of the wafer in the direction of conveyance of the wafer, the cutting blade unit being vertically movable and lifted upward from under the die bonding sheet so that the cutting blade is brought into contact with the base provided with heat-sensitive adhesive layer of the die bonding sheet, and a cutting press unit adapted to, upon lifting of the cutting blade unit upward, press the die bonding sheet downward from above the die bonding sheet to thereby effect cutting of only the base provided with heat-sensitive adhesive layer of the die bonding sheet.

3. The die bonding sheet sticking apparatus as claimed in claim 1, wherein the leaf detaching means includes a temperature regulating unit capable of cooling or heating the die bonding sheet from its release sheet side at the time of detaching only the leaf portion, corresponding to portion outside the outline of wafer, of the base provided with heat-sensitive adhesive layer of the die bonding sheet.

4. The die bonding sheet sticking apparatus as claimed in claim 1, wherein the leaf detaching means includes a suction detaching unit adapted to, after the cutting by the cutting means, detach only the leaf portion, corresponding to portion outside the outline of wafer, of the base provided with heat-sensitive adhesive layer of the die bonding sheet by suction from thereunder.

5. The die bonding sheet sticking apparatus as claimed in claim 4, wherein the leaf detaching means includes a removing unit capable of removing the leaf portion, corresponding to portion outside the outline of wafer, having been detached by the suction detaching unit, from the suction detaching unit.

6. The die bonding sheet sticking apparatus as claimed in claim 5, wherein:

the suction detaching unit includes suction members shaped like a comb, and the removing unit includes shake down members shaped like a comb which can be inserted in interstices of the comblike suction members of the suction detaching unit, so that the leaf portion corresponding to portion outside the outline of wafer, having been detached by suction by the comblike suction members of the suction detaching unit, is removed from the suction detaching unit by inserting the comblike shake down members of the removing unit in the interstices of the comblike suction members of the suction detaching unit from thereunder.

7. The die bonding sheet sticking apparatus as claimed in claim 1, wherein the sheet sticking section includes:

a mount table adapted to mount the wafer thereon and including a heater capable of heating the wafer, and a sticking press unit capable of pressing the die bonding sheet having been heated by the mount table downward from above the die bonding sheet so as to stick the base provided with heat-sensitive adhesive layer of the die bonding sheet to the back surface of the wafer disposed on the mount table.

8. The die bonding sheet sticking apparatus as claimed in claim 7, wherein the mount table protrudes upward at a peripheral portion thereof to thereby provide a suction part adapted to fix a peripheral portion of the surface of wafer by suction, the mount table further including an air blow space part surrounded by the suction part and adapted to support the surface of wafer upward from thereunder by compressed air.

9. The die bonding sheet sticking apparatus as claimed in claim 7, wherein the sticking press unit includes a fixed roller and a press moving roller, the fixed roller capable of retaining the die bonding sheet at a position upstream of the wafer, the press moving roller adapted to be moved downstream to thereby effect sticking of the die bonding sheet to the back surface of the wafer.

10. The die bonding sheet sticking apparatus as claimed in claim 9, wherein the press moving roller is provided with a heating unit.

11. The die bonding sheet sticking apparatus as claimed in claim 1, wherein the sheet peeling section includes a mount table adapted to mount the wafer thereon, the mount table protruding upward at a peripheral portion thereof to thereby provide a suction part adapted to fix a peripheral portion of the surface of wafer by suction, the mount table further including an air blow space part surrounded by the suction part and adapted to support the surface of wafer upward from thereunder by compressed air.

12. The die bonding sheet sticking apparatus as claimed in claim 1, wherein the sheet peeling means includes a fixed roller and a pair of peeling moving rollers, the fixed roller capable of retaining the die bonding sheet at its downstream side, the pair of peeling moving rollers adapted to have the die bonding sheet wound round and sandwiched between them and to move upstream of the die bonding sheet so that the release sheet of the die bonding sheet is peeled from the wafer.

13. A method of sticking a die bonding sheet, comprising:

a die bonding sheet cutting step comprising, prior to sticking of a die bonding sheet comprising a release sheet and a base provided with heat-sensitive adhesive layer to a back surface of wafer, cutting only the base provided with heat-sensitive adhesive layer of the die bonding sheet in conformity with an outline of the wafer, said die bonding sheet cutting step being cutting the base provided with heat-sensitive adhesive layer in the direction of a width of the die bonding sheet with a spacing of given distance from a rear end portion of the wafer in the direction of carry of the wafer so as to form a leaf portion; and a leaf detaching step comprising detaching only the leaf portion, corresponding to portion outside the outline of the wafer, of the base provided with heat-sensitive adhesive layer of the die bonding sheet after the cutting in the die bonding sheet cutting step, a die bonding sheet sticking step comprising, after the cutting in conformity with the outline of the wafer in the die bonding sheet cutting step and further after the detaching of only the leaf portion, corresponding to portion outside the outline of the wafer, of the base provided with heat-sensitive adhesive layer of the die bonding sheet, sticking the base provided with heat-sensitive adhesive layer of die bonding sheet which has an outline conforming to that of the wafer, by heating, to the back surface of the wafer, and a sheet peeling step comprising peeling the release sheet of the die bonding sheet from the wafer having the die bonding sheet stuck thereto in the die bonding sheet sticking step.

\* \* \* \* \*